(12) United States Patent
Tanaka et al.

(10) Patent No.: US 11,195,963 B2
(45) Date of Patent: Dec. 7, 2021

(54) TEXTURE STRUCTURE MANUFACTURING METHOD

(71) Applicant: NEC CORPORATION, Tokyo (JP)

(72) Inventors: Tomo Tanaka, Tokyo (JP); Shunsuke Ohkouchi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 157 days.

(21) Appl. No.: 16/498,456

(22) PCT Filed: Mar. 20, 2018

(86) PCT No.: PCT/JP2018/011028
§ 371 (c)(1),
(2) Date: Sep. 27, 2019

(87) PCT Pub. No.: WO2018/180765
PCT Pub. Date: Oct. 4, 2018

(65) Prior Publication Data
US 2021/0193851 A1    Jun. 24, 2021

(30) Foreign Application Priority Data

Mar. 31, 2017 (JP) .............................. JP2017-069827

(51) Int. Cl.
*H01L 31/0236* (2006.01)
*H01L 27/146* (2006.01)
(Continued)

(52) U.S. Cl.
CPC .... *H01L 31/02363* (2013.01); *H01L 27/1469* (2013.01); *H01L 31/02366* (2013.01);
(Continued)

(58) Field of Classification Search
CPC ......... H01L 31/02363; H01L 31/02366; H01L 33/22; H01L 33/0062; H01L 27/1469; H01L 2933/0091
See application file for complete search history.

(56) References Cited

U.S. PATENT DOCUMENTS 10,325,950 B2    6/2019  Sato
2009/0078954 A1*  3/2009  Shim ...................... H01L 33/22
                                                        257/98
(Continued)

FOREIGN PATENT DOCUMENTS

JP    2010-239003 A    10/2010
JP    2011-86762 A      4/2011
(Continued)

OTHER PUBLICATIONS

International Search Report for PCT/JP2018/011028 dated Jun. 12, 2018 (PCT/ISA/210).
(Continued)

*Primary Examiner* — Sitaramarao S Yechuri
(74) *Attorney, Agent, or Firm* — Sughrue Mion, PLLC

(57) ABSTRACT

Provided is a texture structure manufacturing method with which a texture structure can be obtained simply. The texture structure manufacturing method comprises: growing a layer including a randomly distributed nanostructure on a major surface of a base material; forming a light-scattering body having the nanostructure embedded therein; and exposing a surface of the light-scattering body by removing a part or all of the base material and the layer including the nanostructure.

19 Claims, 22 Drawing Sheets

(51) Int. Cl.
*H01L 33/00* (2010.01)
*H01L 33/22* (2010.01)
(52) U.S. Cl.
CPC ......... *H01L 33/0062* (2013.01); *H01L 33/22* (2013.01); *H01L 2933/0091* (2013.01)

(56) References Cited

U.S. PATENT DOCUMENTS

| | | | |
|---|---|---|---|
| 2010/0244169 A1 | 9/2010 | Maeda et al. | |
| 2012/0247560 A1* | 10/2012 | Rim | H01L 31/182 136/261 |
| 2014/0027805 A1* | 1/2014 | Engl | H01L 33/58 257/98 |
| 2014/0061694 A1* | 3/2014 | Leirer | H01L 21/0254 257/95 |
| 2014/0206116 A1* | 7/2014 | Hwang | H01L 33/24 438/29 |
| 2015/0015758 A1 | 1/2015 | Ikeda | |
| 2016/0126419 A1* | 5/2016 | Kum | H01L 33/24 257/76 |
| 2017/0141264 A1 | 5/2017 | Escoubas et al. | |

FOREIGN PATENT DOCUMENTS

| | | |
|---|---|---|
| JP | 2013-179217 A | 9/2013 |
| JP | 2015-18906 A | 1/2015 |
| JP | 2015-115508 A | 6/2015 |
| JP | 2015-220313 A | 12/2015 |
| WO | 2015/186064 A1 | 12/2015 |

OTHER PUBLICATIONS

Written Opinion of the International Searching Authority for PCT/JP2018/011028 dated Jun. 12, 2018 KPCT/ISA/237).

* cited by examiner

1 μm

30 μm

1 μm

TEXTURE STRUCTURE MANUFACTURING METHOD

CROSS REFERENCE TO RELATED APPLICATIONS

This application is a National Stage of International Application No. PCT/JP2018/011028 filed Mar. 20, 2018, claiming priority based on Japanese Patent Application No. 2017-69827, filed Mar. 31, 2017.

TECHNICAL FIELD

The present invention relates to a texture structure manufacturing method.

BACKGROUND ART

In an optical device such as a photoelectric conversion element and an optical sensor, a concave and convex structure for reducing light reflection may be formed on a light receiving surface.

In a solar battery described in Patent Literature 1 (PTL1), a moth eye structure is formed by a conductive substance on a transparent conductive layer having a texture structure.

An imaging element described in Patent Literature 2 (PTL2) includes a photoelectric conversion portion for converting received light into electric charges, and a semiconductor substrate including the photoelectric conversion portion, in which a large number of regions having a refractive index being different from a refractive index of the semiconductor substrate are formed between a surface of the semiconductor substrate where light is incident, and the photoelectric conversion portion. The region is formed to have a shape such that an area is large at a depth close to the surface of the semiconductor substrate where light is incident, and an area is small at a depth far from the surface.

In a solid-state imaging device described in Patent Literature 3 (PTL3), a semiconductor substrate is engraved by dry etching according to a resist pattern, and a concave portion having a V shape in cross-section is formed.

CITATION LIST

Patent Literature

[PTL1] Japanese Patent Application Laid-Open No. 2013-179217
[PTL2] Japanese Patent Application Laid-Open No. 2015-18906
[PTL3] Japanese Patent Application Laid-Open No. 2015-220313

SUMMARY OF INVENTION

Technical Problem

For example, when an optical image sensor employing a compound semiconductor having a random light scattering surface is manufactured, it is desirable to form the scattering surface at a position as close as possible to a light receiving layer, for the purpose of reducing crosstalk by scattered light.

Further, it is often the case that an optical image sensor employing a compound semiconductor has a structure formed by bonding, by using a flip chip bonding, a chip including a light receiving portion, and a readout circuit chip by a silicon complementary metal oxide semiconductor (Si-CMOS). At this occasion, a scattering surface is formed on a back surface of the light receiving portion. Therefore, when a scattering surface is formed before flip chip bonding, the flip chip bonding becomes difficult, since the chip having the light receiving portion is very thin, and has a microstructure.

Further, when thinning is performed from a back surface up to a position near a light receiving layer after flip chip bonding, and thereafter, a random pattern for forming a scattering surface is formed by photolithography or the like, it is difficult to satisfy both of productivity and reliability.

An object of the present invention is to solve the above-described problems, and provide a texture structure manufacturing method capable of acquiring a texture structure in a simplified way.

Solution to Problem

To achieve the above-mentioned object, a method for manufacturing a texture structure according to the present invention, comprises: growing a layer including a randomly distributed nanostructure on one major surface of a base material; forming a light-scattering body having the nanostructure embedded therein; and exposing a surface of the light-scattering body by removing a part or whole of the base material and the layer including the nanostructure.

Advantageous Effects of Invention

The present invention is able to provide a more simplified manufacturing method of an optical device having a texture structure.

Figure 2:
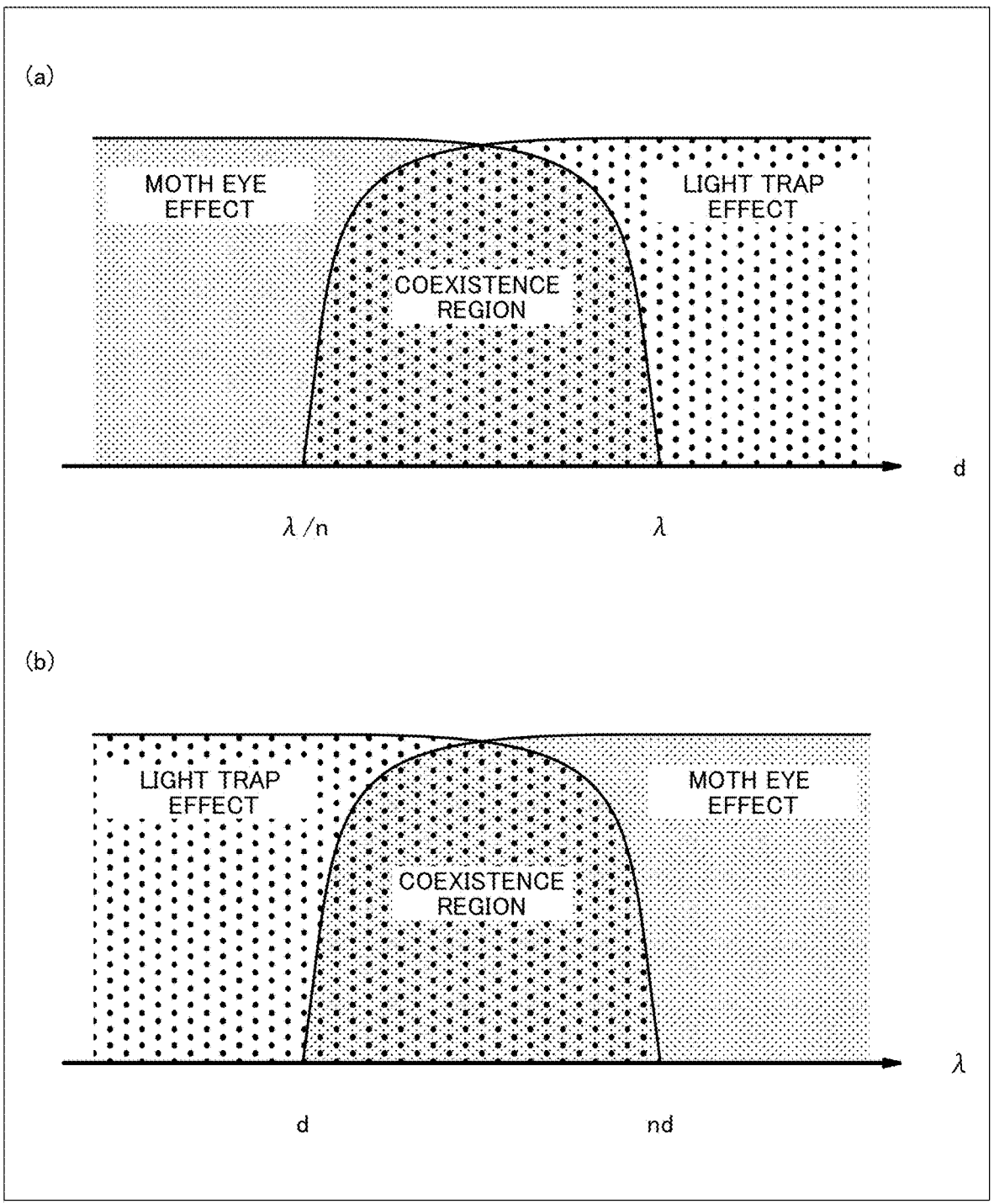

(a) of FIG. 2 is a first schematic diagram illustrating a principle of the optical sensor according to the example embodiment, and (b) of FIG. 2 is a second schematic diagram illustrating the principle of the optical sensor according to the example embodiment.

Figure 3:
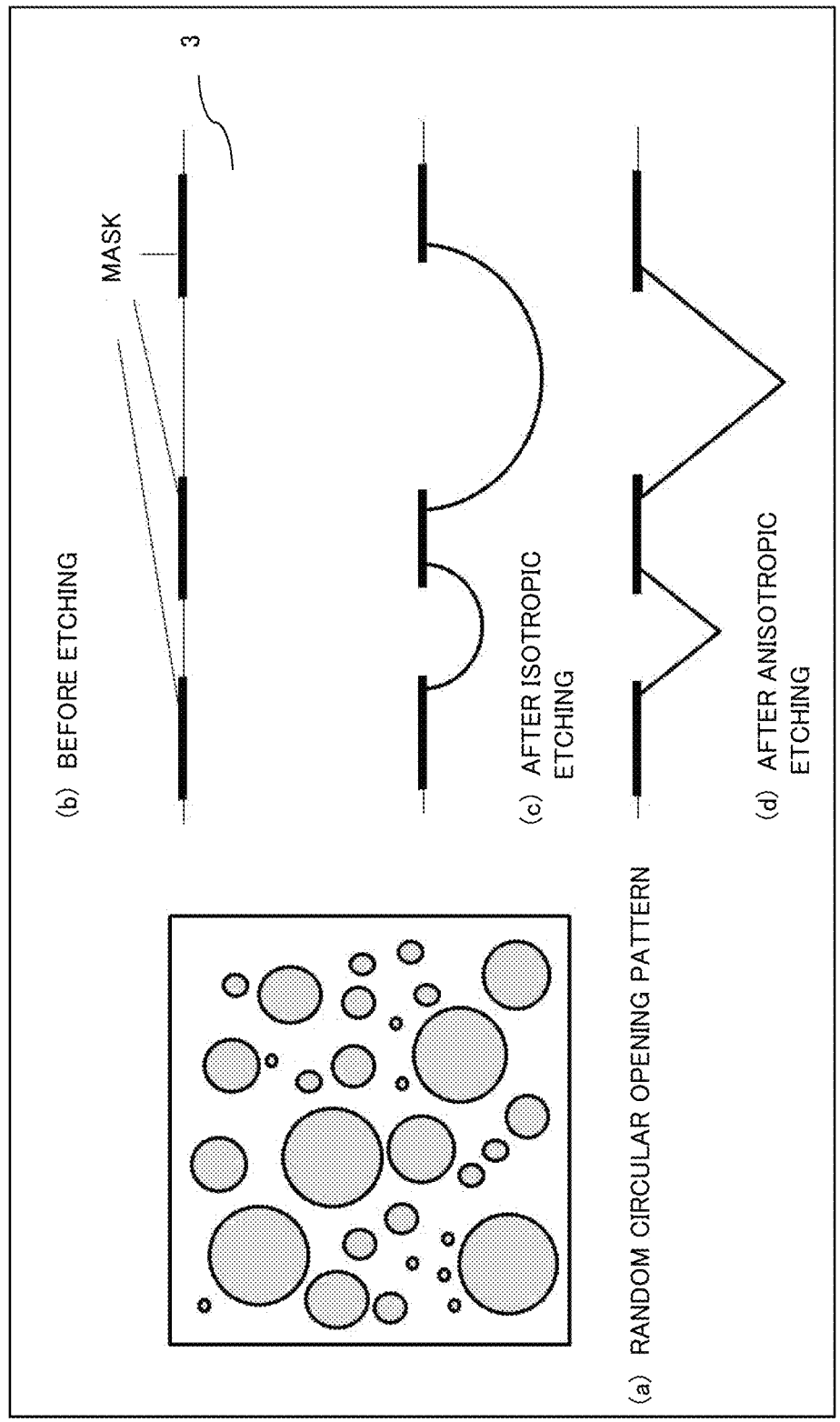

(a) to (d) of FIG. 3 are process diagrams illustrating a random texture structure manufacturing method according to a background art.

Figure 4:
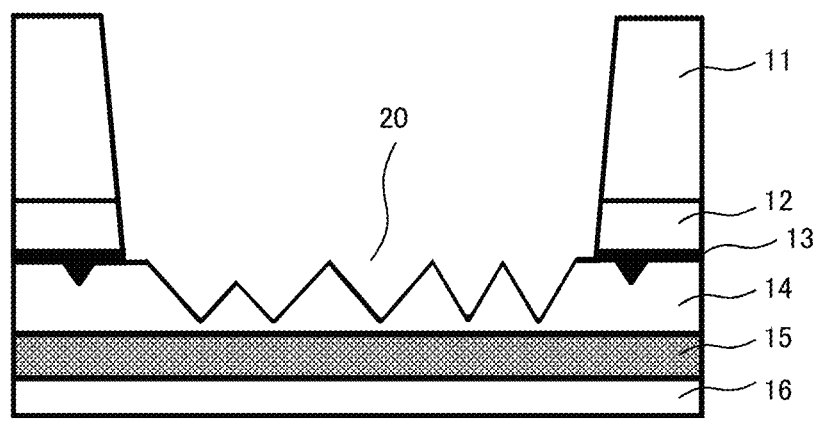

FIG. 4 is a cross-sectional view of a semiconductor optical device to be manufactured by a texture structure manufacturing method according to a first example embodiment of the present invention.

Figure 5:
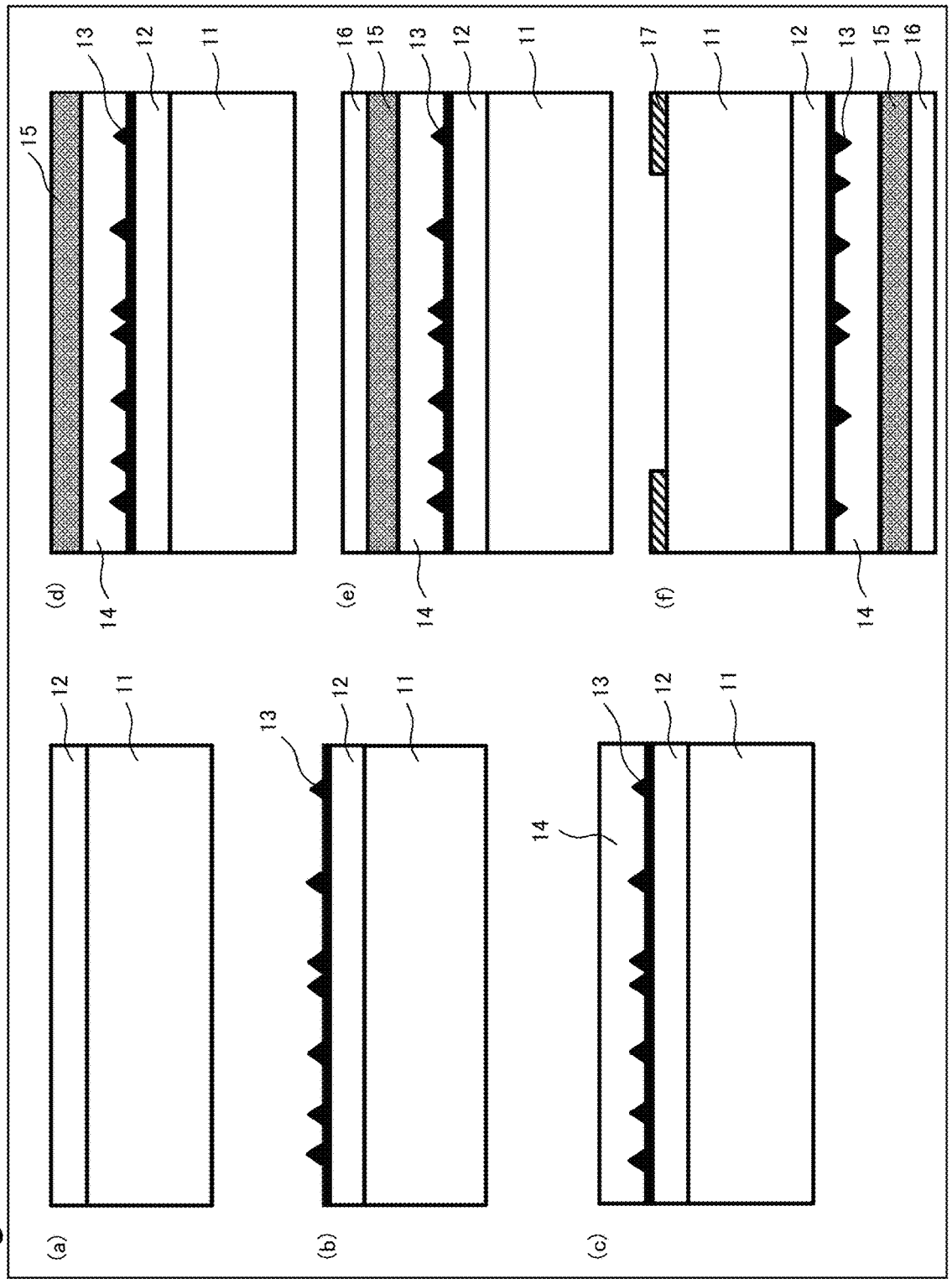

(a) to (f) of FIG. 5 are cross-sectional views illustrating a manufacturing process of the semiconductor optical device in FIG. 4.

Figure 6:
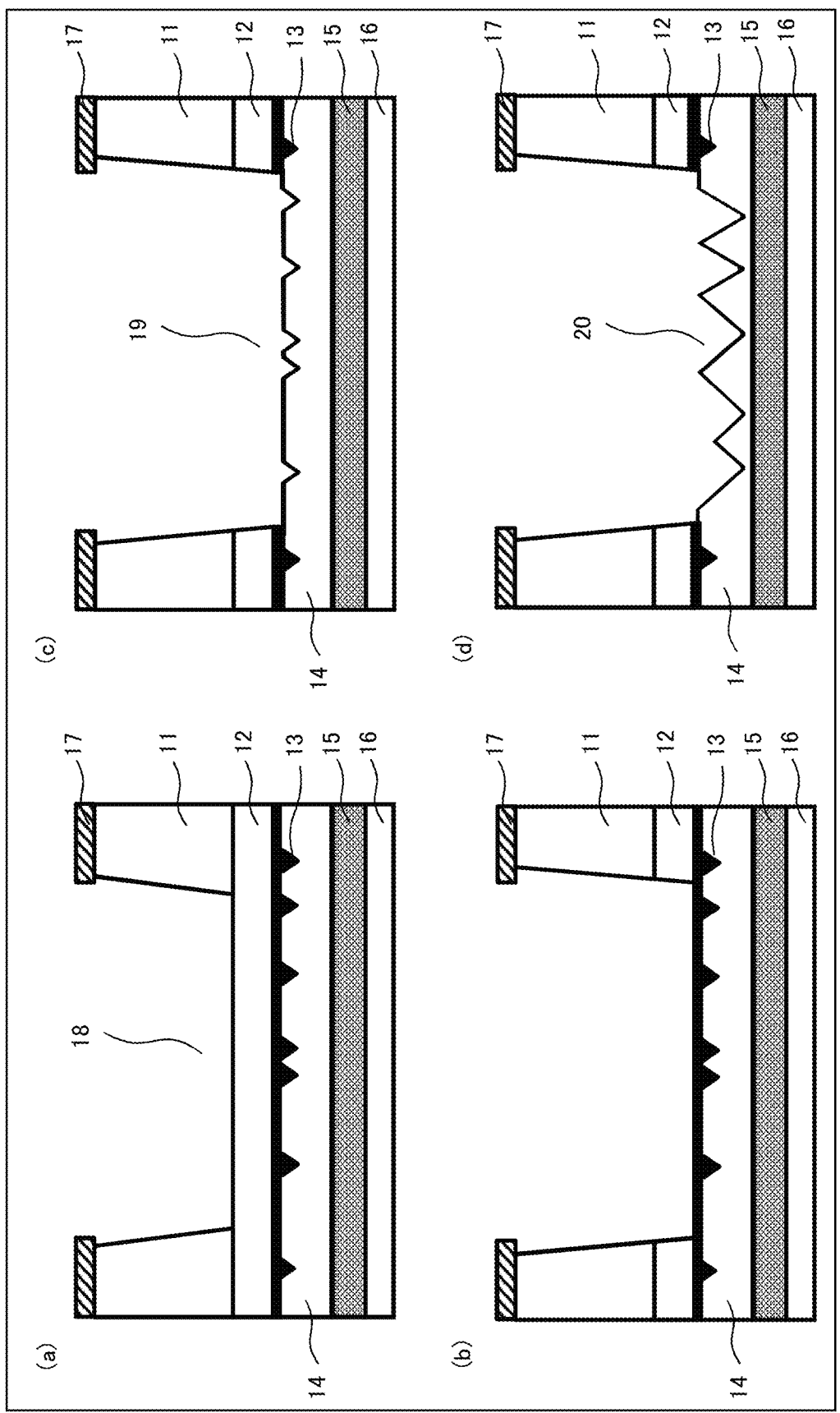

(a) to (d) of FIG. 6 are cross-sectional views illustrating the manufacturing process of the semiconductor optical device in FIG. 4.

Figure 7:
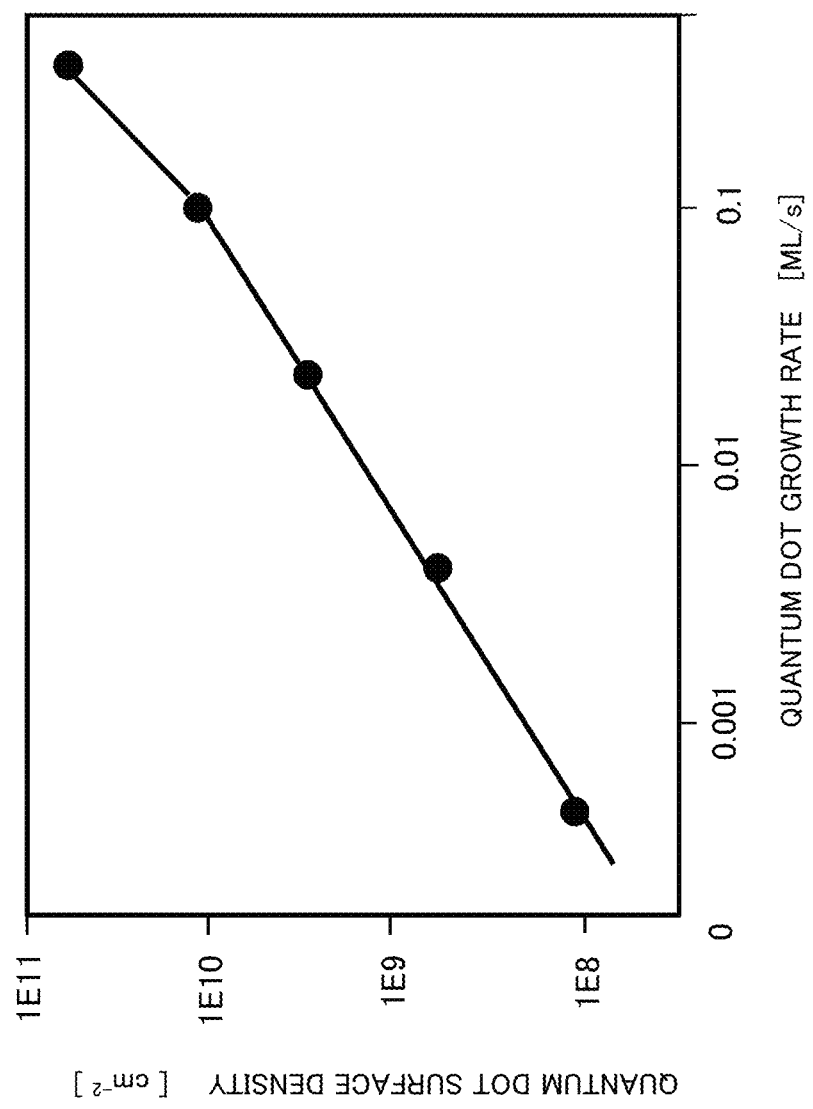

FIG. 7 is a graph illustrating a relationship between a quantum dot growth rate and a quantum dot surface density.

Figure 8:
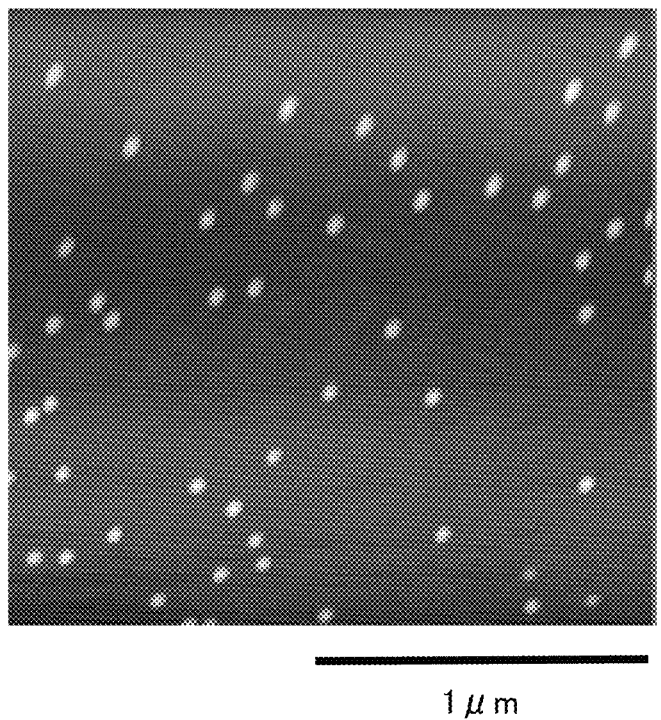

FIG. 8 is an atomic force microphotograph of a manufacturing example of low-density quantum dots.

Figure 9:
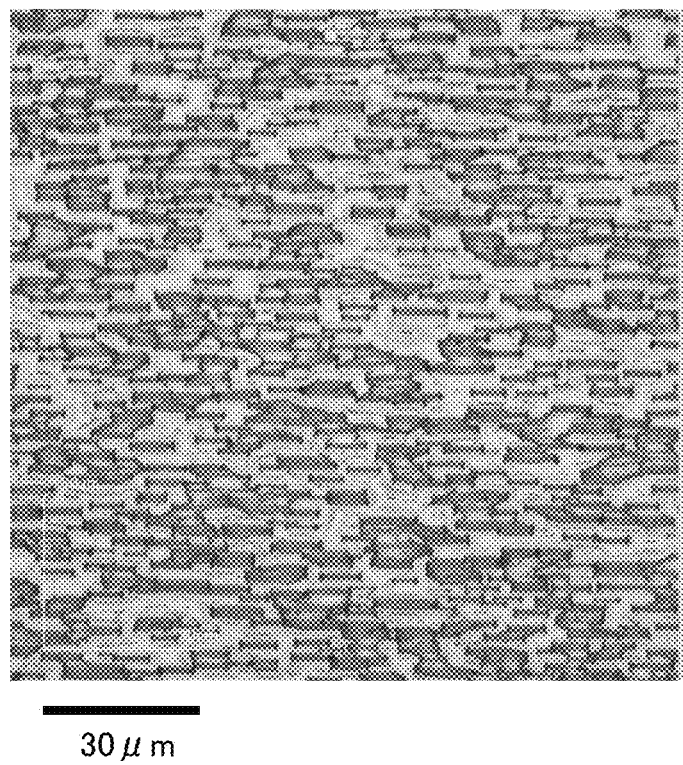

FIG. 9 is a surface photograph of a manufactured random texture structure.

Figure 10:
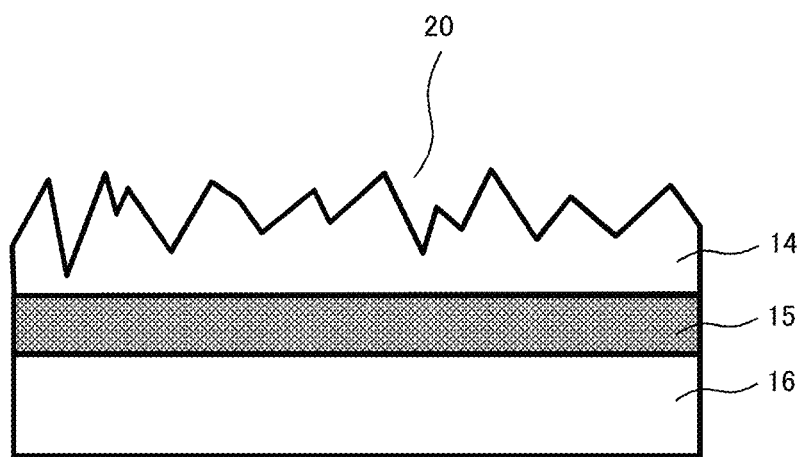

FIG. 10 is a cross-sectional view of a semiconductor optical device to be manufactured by a texture structure manufacturing method according to a second example embodiment of the present invention.

Figure 11:
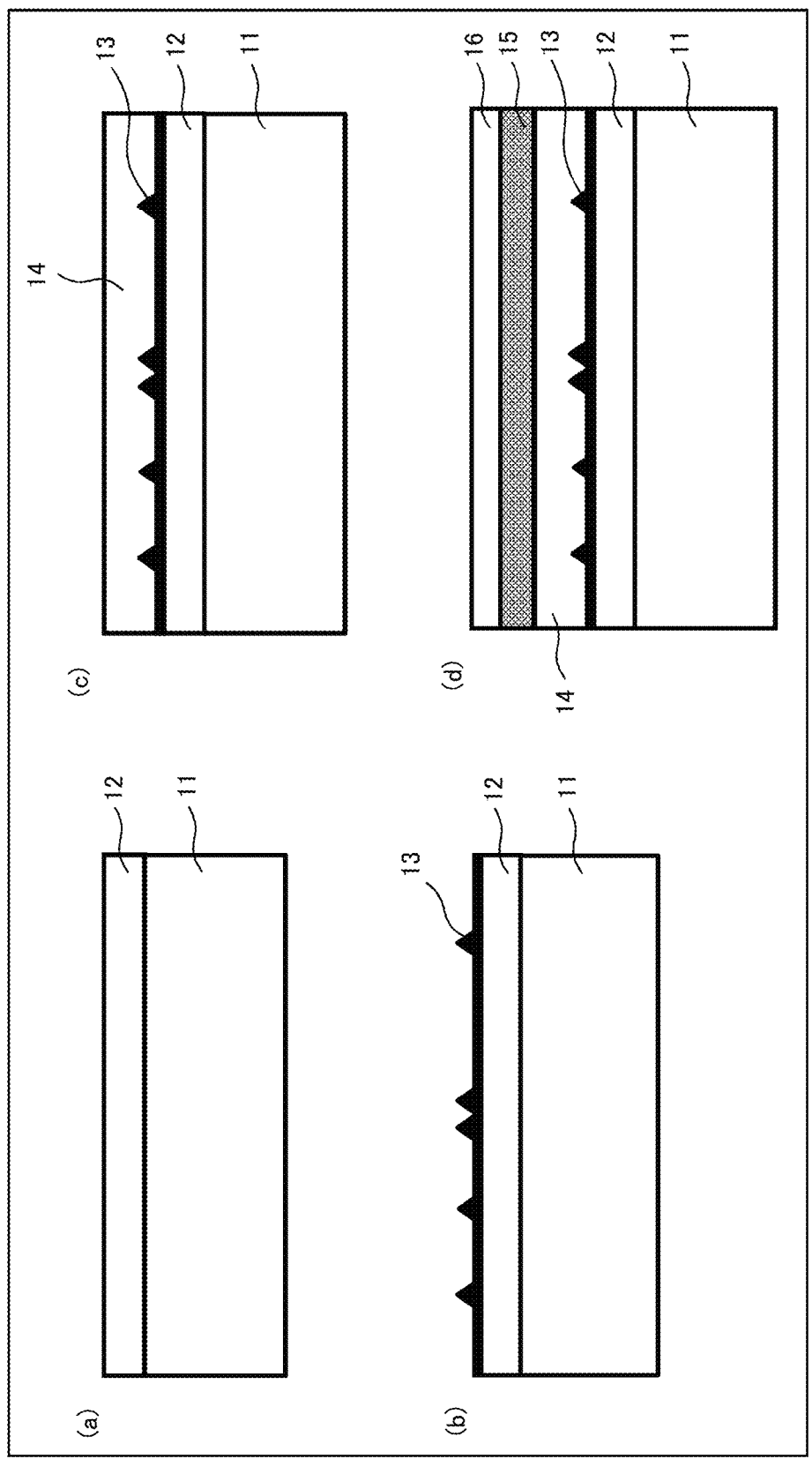

(a) to (d) of FIG. 11 are cross-sectional views illustrating a manufacturing process of the semiconductor optical device in FIG. 10.

Figure 12:
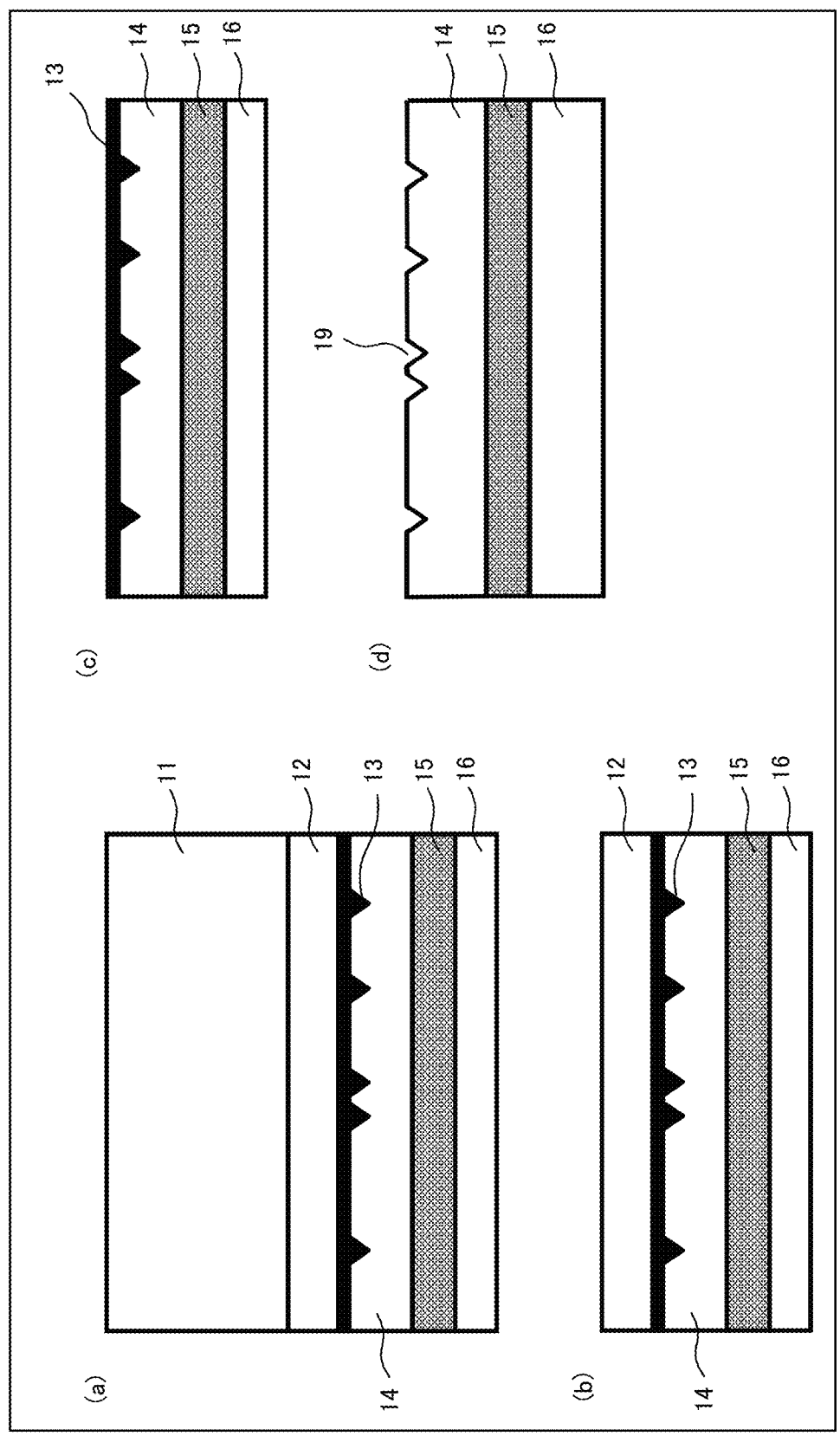

(a) to (d) of FIG. 12 are cross-sectional views illustrating the manufacturing process of the semiconductor optical device in FIG. 10.

Figure 13:
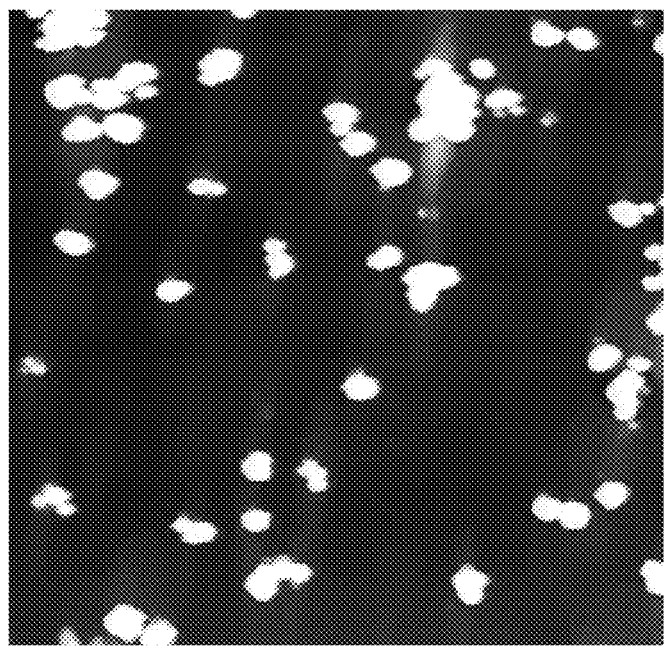

FIG. 13 is an atomic force microphotograph of a manufacturing example of a nanostructure having a structure in which a plurality of quantum dots are aggregated.

Figure 14:
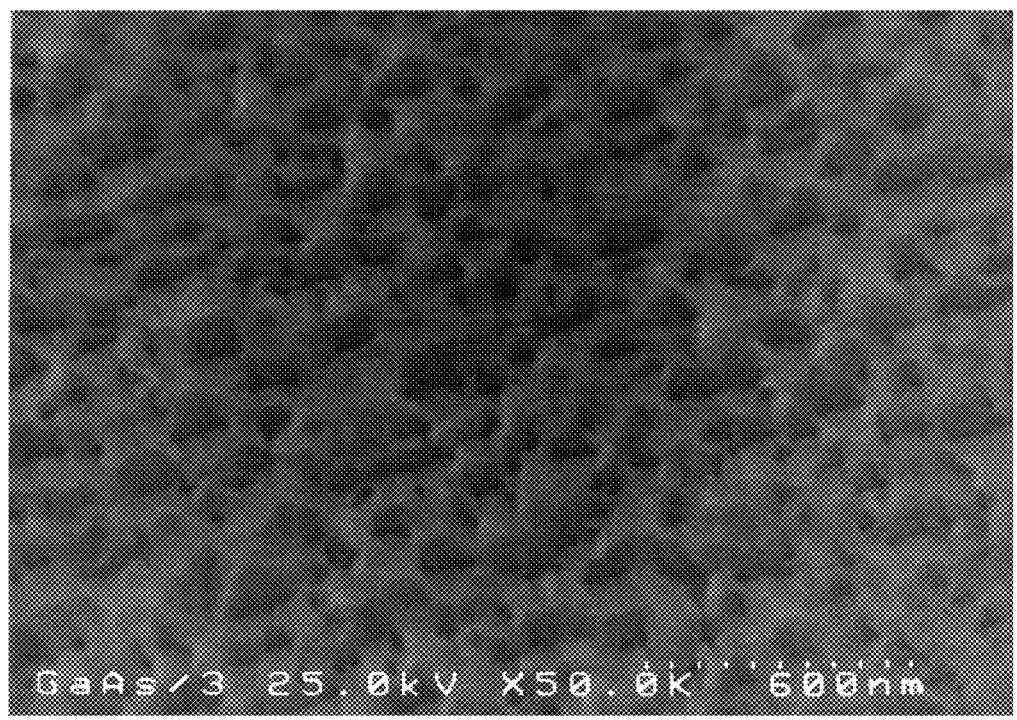

FIG. 14 is an electron microphotograph of a manufacturing example of a nanostructure formed by combining a large number of quantum dots.

Figure 15:
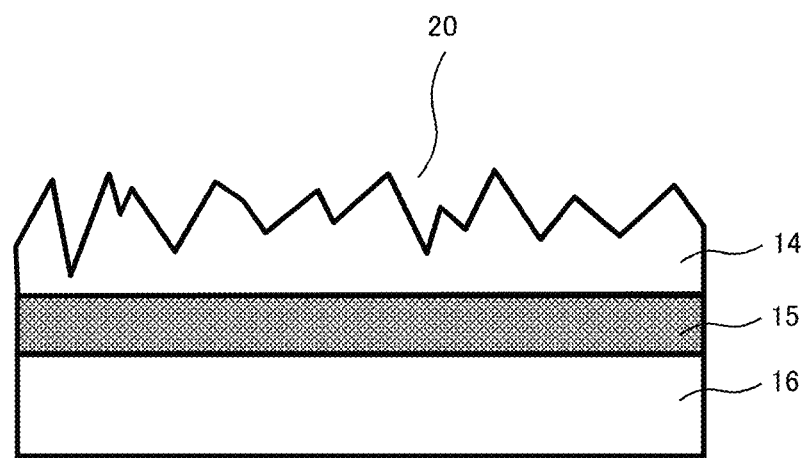

FIG. 15 is a cross-sectional view of a semiconductor optical device to be manufactured by a texture structure manufacturing method according to a third example embodiment of the present invention.

Figure 16:
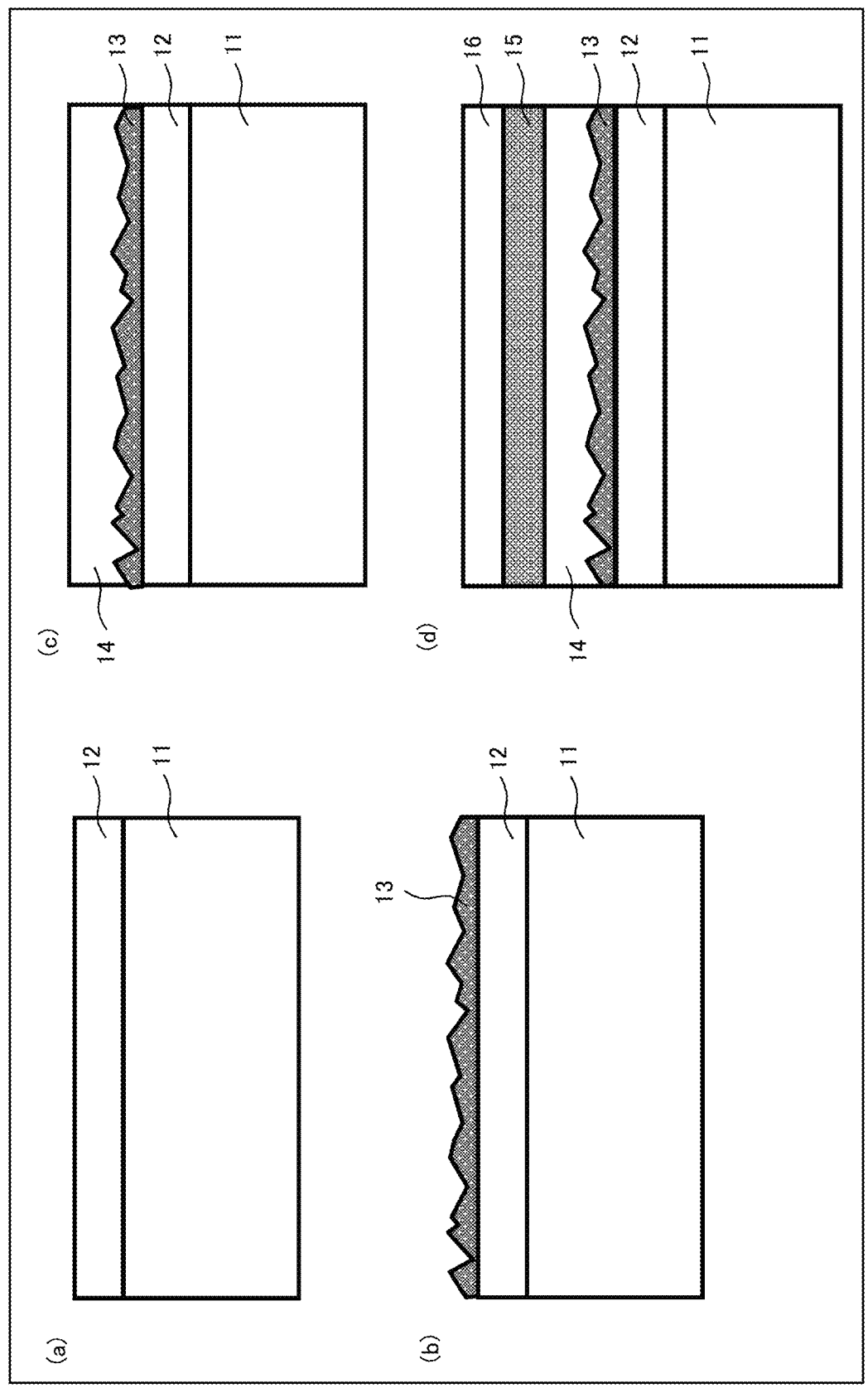

(a) to (d) of FIG. 16 are cross-sectional views illustrating a manufacturing process of the semiconductor optical device in FIG. 15.

Figure 17:
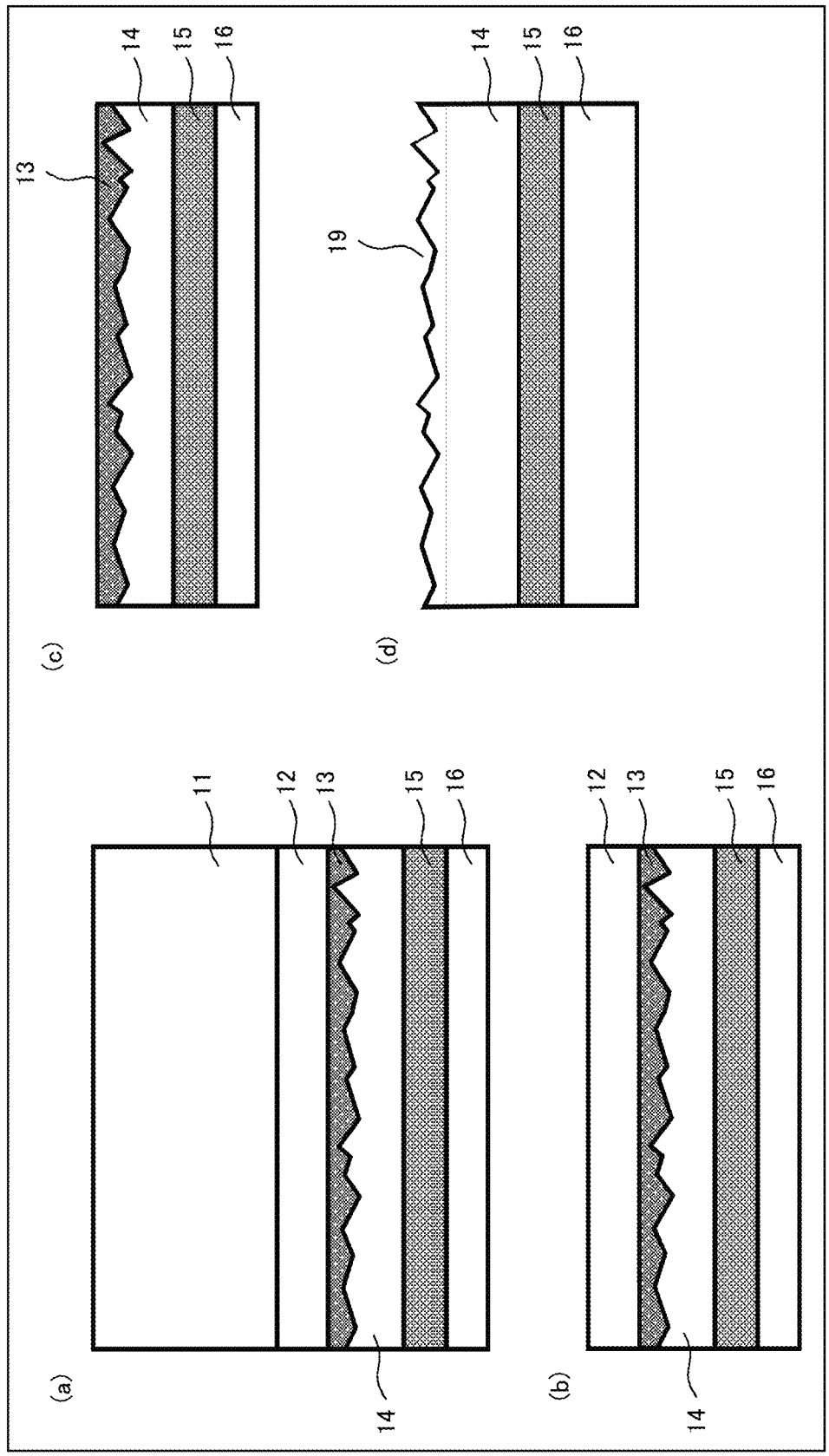

(a) to (d) of FIG. 17 are cross-sectional views illustrating the manufacturing process of the semiconductor optical device in FIG. 15.

Figure 18:
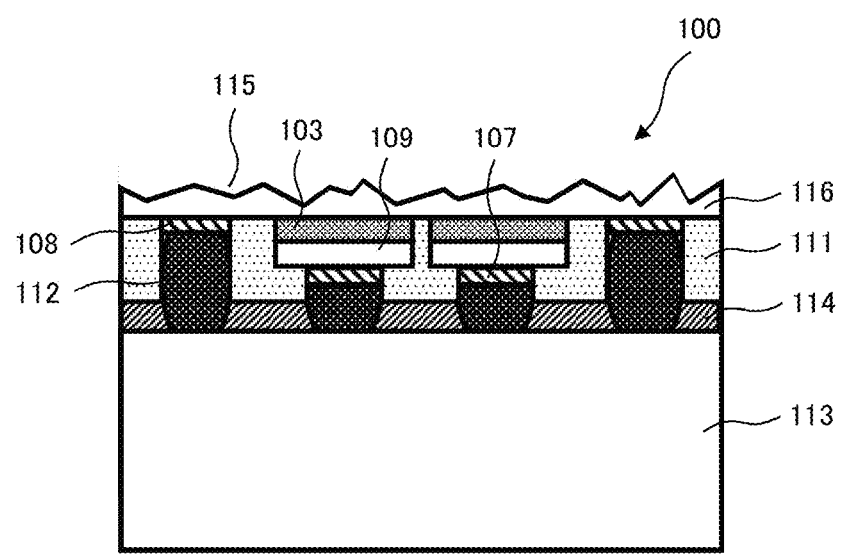

FIG. 18 is a cross-sectional view of a thin film semiconductor optical sensor to be manufactured by applying a texture structure manufacturing method according to a fourth example embodiment of the present invention.

Figure 19:
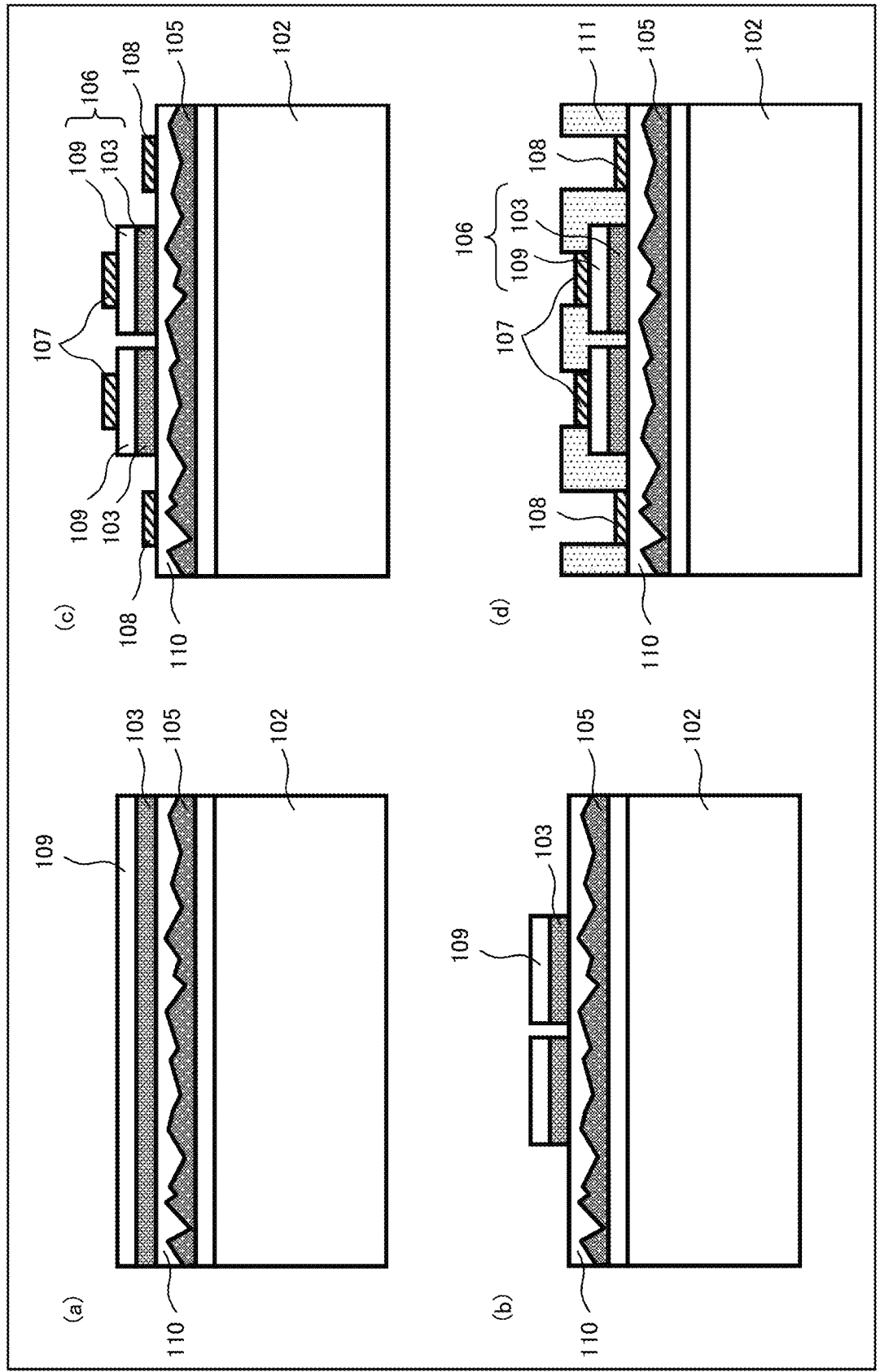

(a) to (d) of FIG. 19 are cross-sectional views illustrating a manufacturing process of the thin film semiconductor optical sensor in FIG. 18.

Figure 20:
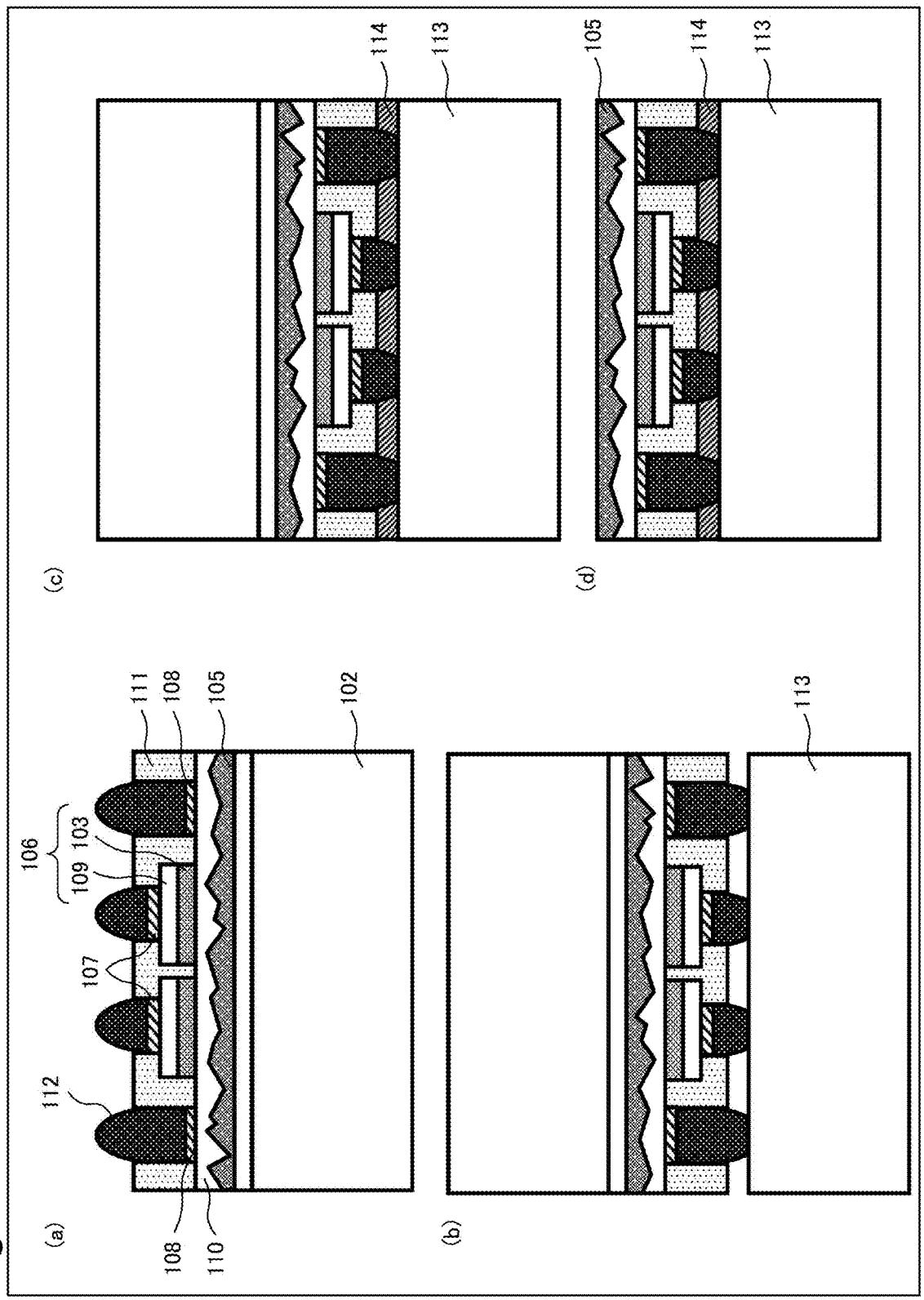

(a) to (d) of FIG. 20 are cross-sectional views illustrating the manufacturing process of the thin film semiconductor optical sensor in FIG. 18.

Figure 21:
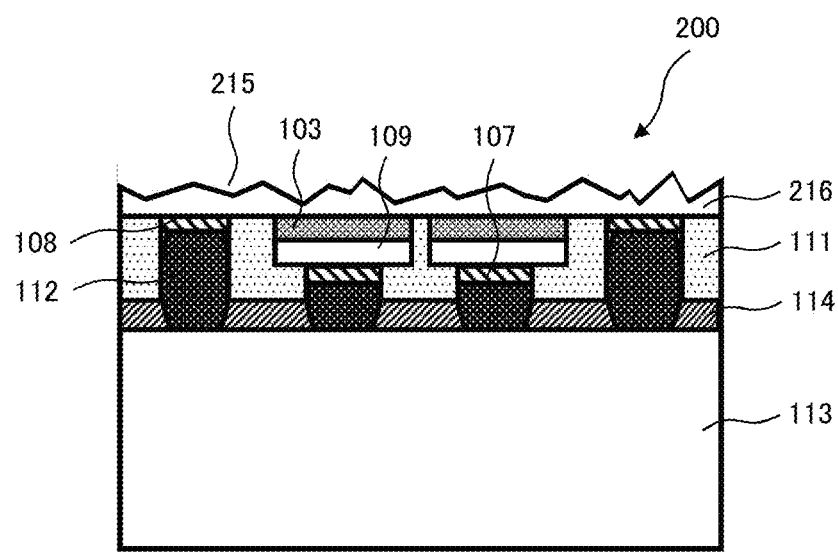

FIG. 21 is a cross-sectional view of a thin film semiconductor optical sensor to be manufactured by applying a texture structure manufacturing method according to a fifth example embodiment of the present invention.

Figure 22:
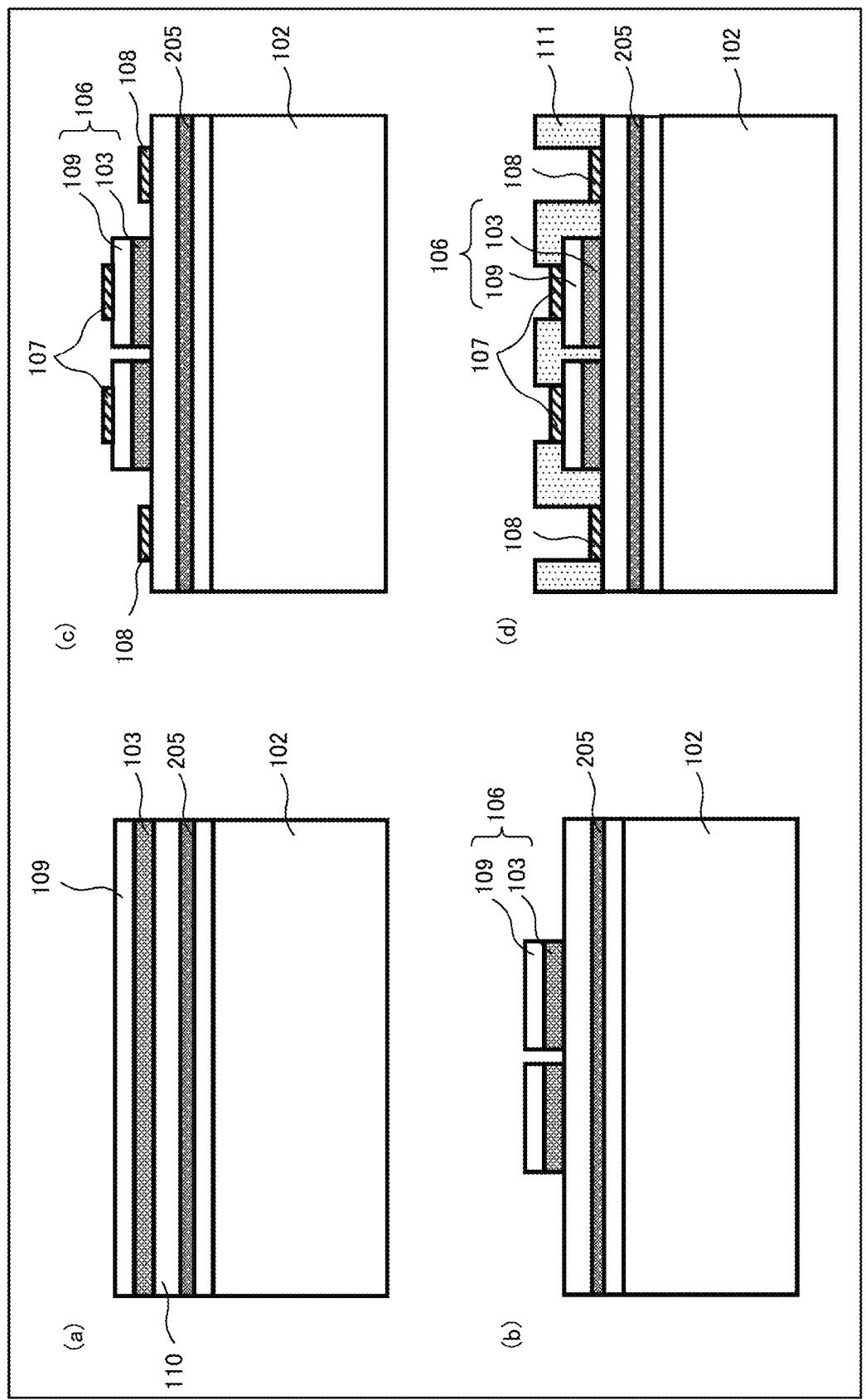

(a) to (d) of FIG. 22 are cross-sectional views illustrating a manufacturing process of the thin film semiconductor optical sensor in FIG. 21.

Figure 23:
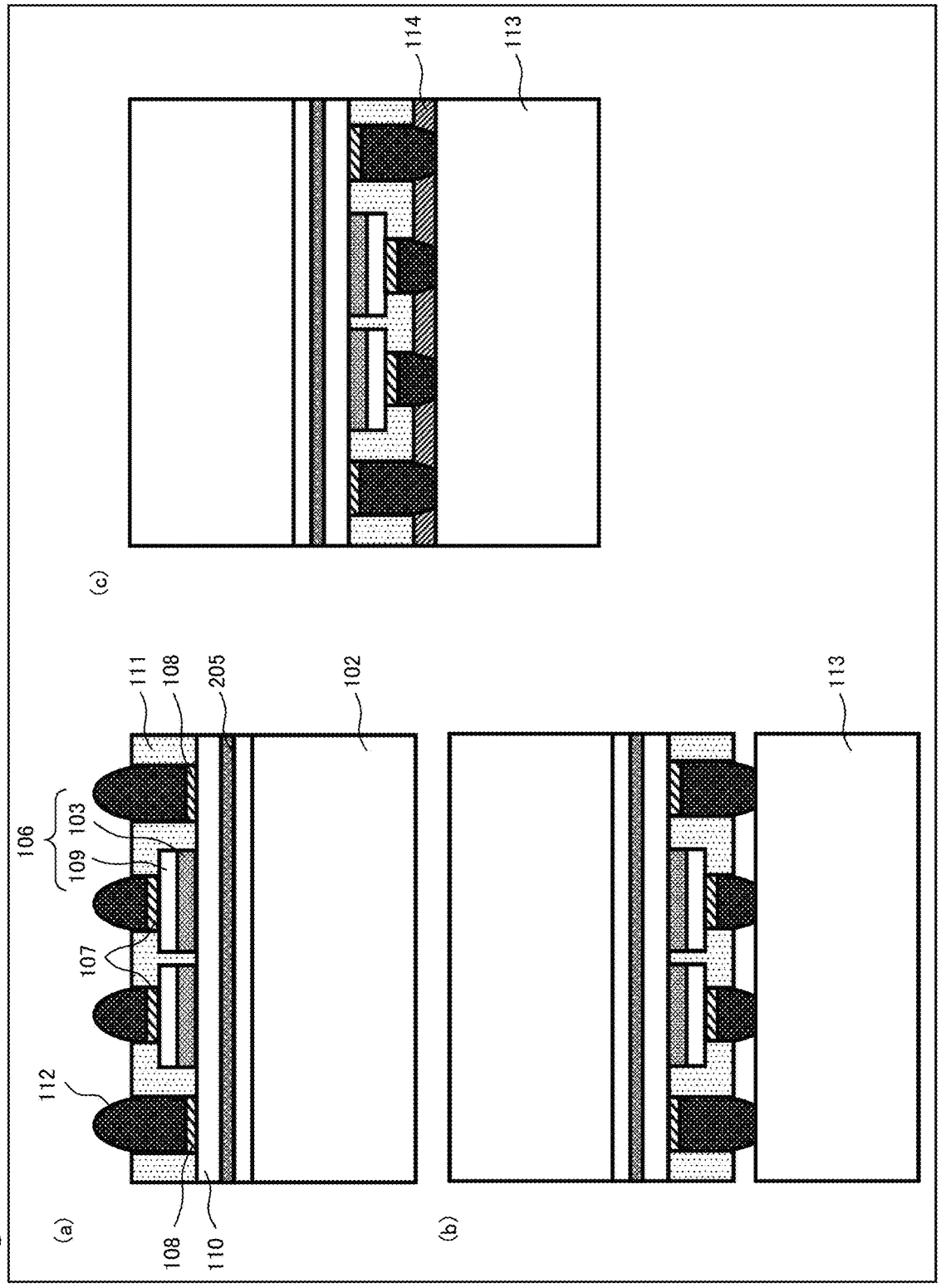

(a) to (c) of FIG. 23 are cross-sectional views illustrating the manufacturing process of the thin film semiconductor optical sensor in FIG. 21.

Figure 24:
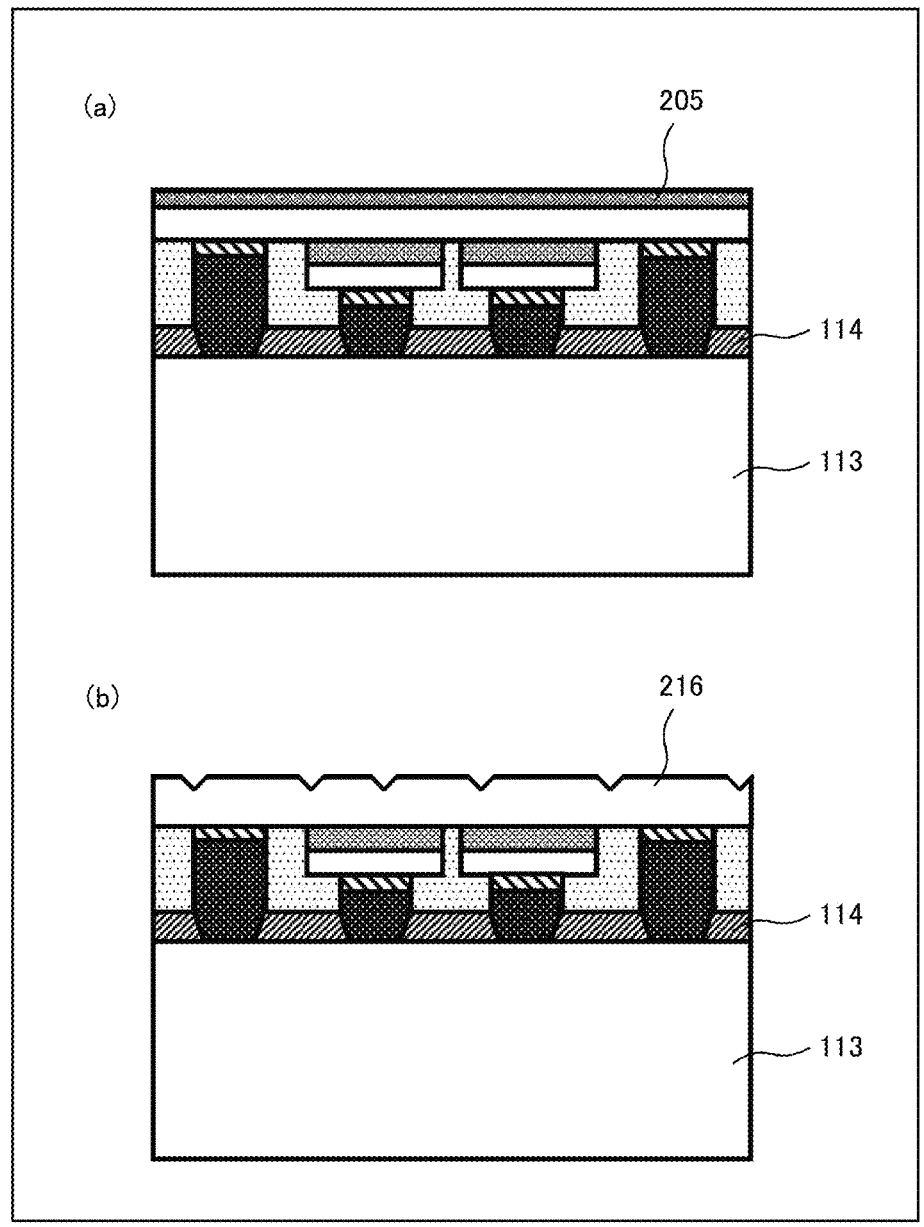

(a) to (b) of FIG. 24 are cross-sectional views illustrating the manufacturing process of the thin film semiconductor optical sensor in FIG. 21.

EXAMPLE EMBODIMENT

Preferred example embodiments according to the present invention are described in detail with reference to the drawings.

Figure 1:
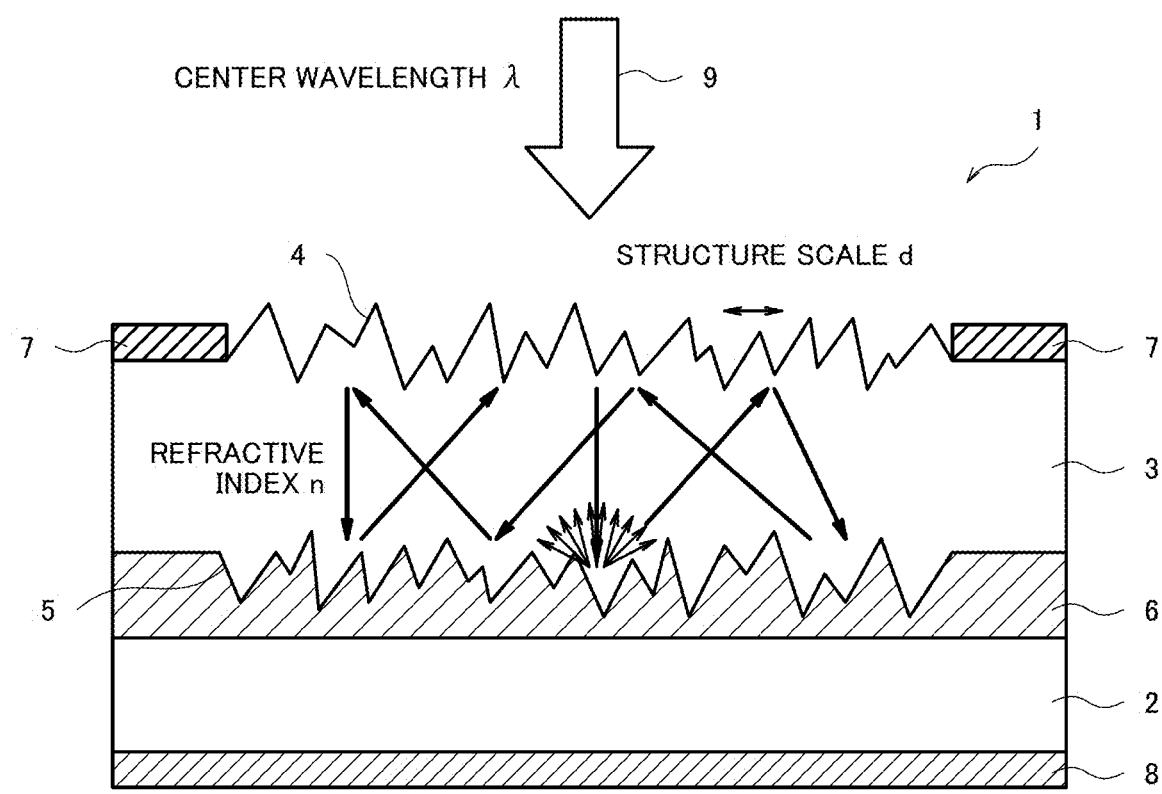
FIG. 1 is a cross-sectional view schematically illustrating one example of a thin film semiconductor optical sensor to be manufactured by a texture structure manufacturing method according to an example embodiment of the present invention.

Before a specific example embodiment according to the present invention is described, an overview of the present invention is described. FIG. 1 is a cross-sectional view schematically illustrating one example of a thin film semiconductor optical sensor to be manufactured by applying a texture structure manufacturing method according to an example embodiment. An optical image sensor 1 according to the present example embodiment has a structure in which a first electrode 8, a substrate 2, a light reflecting body 6, a light absorbing medium 3, and a second electrode 7 are laminated. Incident light 9 is incident on a surface of the light absorbing medium 3 of the optical image sensor 1. Note that the following description is made based on a premise that a direction in which the first electrode 8 of the optical image sensor 1 is present is a down direction, and a direction in which the second electrode 7 is present is an up direction. Description on up and down directions in the following description does not limit a direction in which the optical image sensor 1 is disposed.

The first electrode 8 is formed in contact with the substrate 2. The second electrode 7 is formed in contact with the light absorbing medium 3. By applying an appropriate bias voltage to the first electrode 8 and the second electrode 7, it is possible to withdraw a photocarrier generated by light absorption. Further, although it depends on a device structure, a bias voltage to be applied between the first electrode 8 and the second electrode 7 is generally about several volts.

A GaAs or the like may be used for the substrate 2. It is possible to employ an n-type semiconductor substrate in which an Si of about 1 to $3\times10^{18}$ cm$^{-3}$ is doped in a GaAs.

The light reflecting body 6 is laminated on the substrate 2. The light reflecting body 6 is in contact with a surface of the substrate 2 on a side opposite to a surface to be connected to the first electrode 8. The light reflecting body 6 is able to be made of a metal or the like. The light reflecting body 6 reflects light transmitted through the light absorbing medium 3 toward the light absorbing medium 3. The light reflecting body 6 acts to reflect light that is not totally reflected on a back surface texture structure 5 in such a way that the light does not escape toward the substrate 2 side, and return the light to the light absorbing medium 3 again.

The light absorbing medium 3 is laminated on the light reflecting body 6. As the light absorbing medium 3, a material having a refractive index being capable of absorbing light having a center wavelength λ to be detected by the optical image sensor 1 is used. A thickness of the light absorbing medium 3 is sufficiently smaller than a light penetration length (inverse number of an absorption coefficient). The light absorbing medium 3 has a light incident surface texture structure 4 having concaves and convexes on a surface where the incident light 9 is incident. The light absorbing medium 3 also has the back surface texture structure 5 on an interface with respect to the light reflecting body 6. A typical structure scale of the back surface texture structure 5 is d. When the light incident surface texture structure 4 and the back surface texture structure 5 are formed, light reciprocates multiple times within the light absorbing medium 3 by total reflection of light on an interface of the light absorbing medium 3. On the other hand, there is light that is not totally reflected on the light absorbing medium 3, and escapes toward the substrate 2 transmitted through the light absorbing medium 3. Light that has transmitted through the light absorbing medium 3 is reflected on the light reflecting body 6, and is incident on the light absorbing medium 3 again. A typical structure scale means an average pitch (period) of concave and convex. Note that a texture structure in the present description means both of a structure having concaves and convexes on an exposed surface of a substance, and a structure having concaves and convexes on a laminated interface of the substance with respect to another substance.

Light transmission and light reflection on individual surfaces having concaves and convexes constituting the light incident surface texture structure 4 and the back surface texture structure 5 locally depend on a planar direction thereof, and follows a Snell's law. However, since orientations of individual surfaces having concaves and convexes are irregular, the light incident surface texture structure 4 and the back surface texture structure 5 function, as a whole, as a light scattering surface on which light reflection isotropically occurs on a hemisphere surface. Because of necessity that light reflection on individual surfaces depend on a planar orientation, the typical structure scale d of the light incident surface texture structure 4 and the back surface texture structure 5 is required to satisfy d>(λ/n), by referring to the center wavelength λ and a refractive index n of the light absorbing medium 3. In order to verify whether d>(λ/n) is satisfied, it may be sufficient to evaluate an average pitch of concave and convex of any sample region by various types of surface roughness measuring devices. Note that a depth of a concave and a height of a convex of both the light incident surface texture structure 4 and the back surface texture structure 5 are equal to about the center wavelength λ.

In a thin film semiconductor optical sensor as one example of the optical image sensor according to the present example embodiment, both of multi-path light absorption enhancement by a light trap effect, and semiconductor surface antireflection by a moth eye effect are achieved in a desired wavelength band by applying a single texture structure to a light incident surface. In a thin film semiconductor optical sensor as one example of the optical image sensor according to the present example embodiment, both of multi-path light absorption enhancement by a light trap effect, and semiconductor surface antireflection by a moth eye effect are achieved in a desired wavelength band without causing a problem on reliability and productivity. In the following, details are described.

First, multi-path light absorption enhancement by a light trap effect is described. It is conventionally known that light can be efficiently trapped by effectively utilizing total reflection within an optically thin medium having a higher refractive index than air being an external environment. As expressed by the Fresnel equations, total reflection within a medium occurs only for light having a large incident angle (a small angle with respect to an interface). Light other than the above is transmitted and radiated into the air by refraction on an internal interface. A light mode in which light is incident from the air into a medium, and a light mode in which light is radiated from the inside of a medium into the air, which is an inverse mode of the former light mode have a one-to-one correspondence. When this is referred to as a transmission mode, on a flat interface, the transmission mode does not combine at all with a total reflection mode in which total reflection occurs on an internal interface of a medium. Therefore, when light is incident from the air into a thin film absorbing medium having a flat interface, only double-path light absorption in which light reciprocates one time occurs.

In order to achieve multi-path light absorption, a means for combining a transmission mode with a total reflection mode is necessary. Texturing an interface is one of effective combining means for combining a transmission mode with a total reflection mode. When light scattering reflection on a textured interface occur isotropically on a hemisphere surface, a probability with which light subjected to total reflection on a textured surface is transmitted through the air without total reflection on a succeeding textured surface is decreased to $1/n^2$. Consequently, light is trapped in an optically and sufficiently thin uniform medium having a refractive index n, which is surrounded by a textured surface, and emitted to the air after undergoing total reflection on an interface $n^2$ times in average. As a result that a path length until light is emitted to the air is multiplied $n^2$ times, a light intensity within the medium is enhanced $n^2$ times, and absorption efficiency of the medium improves. Absorption enhancement occurs by multi-path light absorption.

In order to enhance absorption by trapping light, the following two conditions are necessary.

(1) A medium has a high refractive index, and is optically thin, and (2) Light scattering reflection isotropically occur on a hemisphere surface at a textured interface in order to effectively combine a transmission mode and a total reflection mode.

In order to satisfy the condition (2), it is necessary that a typical structure scale of a texture structure is larger than a wavelength order of incident light, in view of necessity that the textured surface has a structure in which a planar direction is random, and light reflection on individual surfaces of the texture structure depends on individual planar orientations.

Next, surface antireflection by a moth eye effect is described. In a textured surface having a structure that changes at a scale smaller than a wavelength order of incident light, a moth eye effect such that a vertical reflectance of air with respect to a medium on a medium interface having a refractive index n ideally decreases from $((n-1)/(n+1))^2$ to 0 is known. This is because, in a texture structure having a typical structure scale smaller than a wavelength order, an operation on incident light by a diffraction effect does not depend on a planar orientation of individual concave or convex, and functions as one kind of a refractive index matching layer in which an effective refractive index gradually changes from 1 to n. Although a moth eye effect functions as a refractive index matching layer in which a drastic change of an interface refractive index is buffered irrespective of an optical thickness of a medium, the moth eye effect does not contribute at all to combining a transmission mode and a total reflection mode. Since a decrease in reflectance increases an amount of light that reaches an absorbing layer, absorption enhancement occurs.

As described above, in an aspect of light absorption enhancement, in an optically thin medium having a typical structure scale of a texture structure larger than a wavelength of light, multi-path light absorption enhancement by a light trap effect is important. When the typical structure scale of the texture structure is small, incident surface antireflection by a moth eye effect is important irrespective of an optical thickness of a medium. In other words, in a textured surface having concaves and convexes arranged at a single pitch, a light trap effect is important for light having a wavelength shorter than a structure scale of the textured surface, and a moth eye effect is important for light in a long wavelength region. Since these conditions are obviously exclusive of each other, it has been believed that, in a texture structure having concaves and convexes at a single pitch, it is not possible to simultaneously receive benefits of a light trap effect and a moth eye effect for the purpose of absorption enhancement.

For example, in a case of a silicon solar battery, since energy acquisition is a purpose, there is a demand for increasing photoelectric conversion efficiency of light in a broad wavelength region from a near infrared to an ultraviolet region. In order to enhance light absorption in a wavelength region longer than an optically thin bandgap (to 1 μm) by surface texturing, a random textured surface having a structure scale larger than 1 μm where a light trap effect becomes valid is necessary. In order to enhance light absorption in an optically thick ultraviolet region of a wavelength 300 nm or shorter by surface antireflection, a concave and convex structure of a scale smaller than 300 nm at which a moth eye effect becomes valid is necessary. Therefore, it has been difficult to enhance incident light absorption of a silicon solar battery in a wide wavelength region by a texture structure having concaves and convexes at a single pitch.

By forming, on a surface, a double layered texture structure in which texture structures are laminated, it may be possible to achieve a silicon solar battery that simultaneously achieves a light trap effect and a moth eye effect, and has a high photoelectric conversion efficiency of light in a wide wavelength region from a near infrared to an ultraviolet region by absorption enhancement. However, in a double layered texture structure, superiority is low in terms of productivity and reliability.

On the other hand, in a case of an optical sensor aiming at information acquisition, unlike a solar battery, the optical sensor may be frequently used for detecting light in a specific narrow wavelength band. In this case, it becomes possible to achieve a thin film semiconductor optical sensor that simultaneously receives benefits of a light trap effect and a moth eye effect, and has a high photoelectric conversion efficiency of light in a target wavelength band by absorption enhancement. In the following, this is described with reference to the drawings.

FIG. 2(a) is a first schematic diagram illustrating a principle of an optical sensor according to the present example embodiment. A case that a texture structure in which a planar orientation is random is present on a light incident surface and a back surface is considered. FIG. 2(a) illustrates a relationship among a light trap effect, a moth eye effect, and a wavelength of incident light. A horizontal axis d indicates a typical structure scale of a texture structure. When it is assumed that a detection target center wavelength of the optical sensor is k, an effective light wavelength within a medium having a high refractive index (n>1) becomes $\lambda/n$ (d<$\lambda$). When it is assumed that a typical structure scale of a texture structure of a front surface and a back surface is d>$\lambda/n$, since light scattering reflection occur when light is reflected on an interface within a medium, light is trapped within an optically thin absorbing medium for use in a thin film semiconductor optical sensor.

On the other hand, when it is assumed that d<$\lambda$, a moth eye effect occurs for incident light from an outside of the medium. In a case of an optically thin medium in which a structure scale d of a texture structure satisfies $\lambda/n$<d<$\lambda$, when light of the target center wavelength $\lambda$ is incident from a vicinity in a vertical direction, the incident light in which reflection is decreased by a moth eye effect propagates in a direction substantially vertical to the medium according to a Snell's law. The propagated light is isotropically scattered and reflected on a hemisphere surface by the texture structure of the back surface, and is isotropically scattered and reflected on the hemisphere surface again by the texture structure of the front surface after re-propagation. Each time the propagated light is scattered and reflected, a probability with which the light is not totally reflected and is transmitted to the outside of the medium is $1/n^2$. Thus, observed light is trapped within the medium, and is emitted to the air after repeating total reflection on a textured surface $n^2$ times in average.

(b) of FIG. 2 is a second schematic diagram illustrating the principle of the optical sensor according to the present example embodiment, and is a diagram illustrating, by setting $\lambda$ on a horizontal axis, an effect occurred when light of the target center wavelength $\lambda$ is incident from an outside of an absorbing medium having a refractive index n and in which a concave and a convex of a typical structure scale d is formed. The diagram illustrates that both of reduction of incident light reflectance by a moth eye effect, and multi-path light absorption by light trapping are achieved for a light wavelength region where d<$\lambda$<nd. A value for a semiconductor material is from n to about 3.5 from an atom-filling density. Therefore, a wavelength bandwidth that can achieve both of the two effects approximately becomes $\Delta\lambda=(n-1)d$ to $2.5d$. When a center of the band $(n+1)d/2$ is made coincide ($\lambda=(n+1)d/2$) with the center wavelength $\lambda$ of observation target light, $\Delta\lambda$ becomes $\Delta\lambda=2\lambda(n-1)/(n+1)$. When it is assumed that n=3.5, the value becomes a value of an order of a center wavelength of detection target light, namely, $\Delta\lambda$ to $1.11\lambda$. Therefore, when this principle is applied to detection of light in an infrared region where $\lambda>1$ μm, it becomes possible to achieve a thin film semiconductor optical sensor that simultaneously receives benefits of a light trap effect and a moth eye effect of detection target light in a substantially and practically sufficient band, and has a high photoelectric conversion efficiency by absorption enhancement due to each of the effects.

By using the above-described principle, the optical sensor according to the present example embodiment achieves a thin film semiconductor optical sensor that simultaneously receives benefits of a light trap effect and a moth eye effect for light in a target wavelength band by a single pitch structure, and has a high photoelectric conversion efficiency by absorption enhancement, based on each of the effects. In view of this, a texture structure in which a planar direction is random is formed on a light incident surface and a back surface of a light absorbing medium, and the typical structure scale d of the texture structure becomes to satisfy $(\lambda/n)<d<\lambda$ according to the center wavelength $\lambda$ of target light. Further, a midpoint $(n+1)d/2$ between the structure scale d viewed from the outside of the medium, and a typical structure scale nd viewed from the inside of the medium is made coincide with the center wavelength $\lambda$ of target detection light. In other words, $\lambda=(n+1)d/2$ is satisfied. When it is assumed that $\lambda=1$ μm and n=3.5, $(\lambda/n)<d<\lambda$ is 0.28 μm<d<1 μm. When it is assumed that $\lambda$ and d satisfy $\lambda=(n+1)d/2$, d=0.44 μm.

Conventionally, a photolithography method is employed for forming a random texture structure in which at least either a pitch of concave and convex, or an individual planar direction of a concave and a convex is irregular. In other words, a general method includes growing a semiconductor layer on a light absorbing layer of an optical sensor, forming a mask having a random pattern on a flat surface of the semiconductor layer, and manufacturing by a chemical etching method.

(a) to (d) of FIG. 3 illustrate an etching method to be specifically performed. As a mask for a random pattern, for example, a random circular opening pattern as illustrated in a plan view of (a) of FIG. 3 is prepared. Gray portions in (a) of FIG. 3 indicate random openings. A mask for a random pattern is formed on a surface of a semiconductor layer in which a light absorbing medium and the like are formed. (b) of FIG. 3 illustrates a cross-sectional view of representative large and small two openings among random circular opening patterns. A light absorbing medium having a mask formed as described above is immersed in an etchant for an appropriate time. The appropriate time is a time to be determined depending on a size, an interval, and the like of a random pattern, which is intended to be manufactured, as far as each of patterns are not uniform. Thus, a small opening portion is etched into a small hole, and a large opening portion is etched into a larger hole. Consequently, a random structure having a shape as illustrated in the cross-sectional view of (c) of FIG. 3 is formed.

(c) of FIG. 3 illustrates a case after isotropic etching, and illustrates a case (moistening speed into a substrate)>(side etching speed of a portion beneath a mask (end portion)). In this example, an isotropic etchant (e.g. a solution in which a small amount of Br is dissolved in methanol) is used. (d) of FIG. 3 illustrates a case after anisotropic etching. When etching is performed by using an anisotropic etchant (e.g., a mixed solution of ammonia water and hydrogen peroxide water), while using a mask pattern having square (or polygonal) random openings, a random structure composed of inverted pyramidal holes as illustrated in the cross-sectional view of (d) of FIG. 3 is formed.

However, when a texture structure is manufactured by the present method, it is necessary to manufacture a mask for a random pattern. The random pattern is required to be such that a size distribution and a space distribution of openings are random with respect to a predetermined wavelength. Designing a mask for the random pattern is cumbersome. Further, since a photolithography method is employed, it is necessary to perform a process of forming a random pattern on a resist film, a dielectric film, or the like, performing etching by using the formed random patterns as a mask, and then removing the resist film or the dielectric film. Therefore, a wafer may be contaminated accompanied by the process of removing the resist film or the dielectric film.

Further, generally, a random texture structure exhibits the effects more effectively by forming the random texture structure on a light absorbing layer, a light emitting layer, and the like on a substrate side, or both of the substrate side and a wafer surface side, which is opposite to the substrate side.

When a random texture structure is manufactured by a photolithography method, it is easy to manufacture the random texture structure on a wafer surface side (side opposite to a substrate side). However, when a random texture structure is tried to be manufactured on the substrate side being opposite to the wafer surface side, it is necessary to remove a semiconductor substrate of a certain thickness over the entire surface or partially. When a semiconductor substrate is removed over the entire surface, handling may become difficult due to thinning of a wafer. Further, when a semiconductor substrate is partially removed, it is necessary to manufacture a hole structure (barus structure) in which a semiconductor substrate is removed except for a region where light emission/light reception is performed, and manufacture a random texture structure on a bottom portion of the hole. Therefore, there occurs a problem such that a resist film cannot be uniformly coated, contact exposure cannot be performed, or the like. There is an issue that a process becomes extremely difficult by an ordinary photolithography method.

First Example Embodiment

A texture structure manufacturing method according to a first example embodiment of the present invention, and an optical image sensor as one example of a device to be manufactured by the manufacturing method and an operation principle thereof are described. More specifically, as one example of the optical image sensor, a thin film semiconductor optical sensor is described. FIG. 4 is a cross-sectional view of a semiconductor optical device to be manufactured by the texture structure manufacturing method according to the first example embodiment of the present invention. (a) to (f) of FIG. 5 and (a) to (d) of FIG. 6 are cross-sectional views illustrating a manufacturing process of the semiconductor optical device in FIG. 4.

(Description on Configuration)

The semiconductor optical device in FIG. 4 includes a semiconductor substrate 11, a first semiconductor layer 12, a second semiconductor layer 13, a third semiconductor layer 14, a semiconductor active layer 15, and a semiconductor cover layer 16. In particular, the semiconductor optical device in FIG. 4 is a semiconductor optical device having a random texture structure 20 within a barus structure.

(Description on Manufacturing Method)

Referring to FIGS. 4 to 6, a texture structure manufacturing method according to the present example embodiment, and a semiconductor optical device manufacturing method according to the present example embodiment are described. The present example embodiment is described based on a premise that GaAs is used for the semiconductor substrate 11, the first semiconductor layer 12, and the third semiconductor layer 14. Further, the present example embodiment is described based on a premise that a quantum dot layer made of InAs is used as the second semiconductor layer 13 and the semiconductor cover layer 16.

Furthermore, the present example embodiment is described based on a premise that a light absorbing layer in an infrared region constituted of a plurality of semiconductor layers including InAs quantum dots is used as the semiconductor active layer 15.

Note that the present example embodiment is merely one example of the present invention, and may be modified as far as the modification exhibits an advantageous effect described in the present example embodiment by a component factor and the like of a device structure. The semiconductor material may be another material, and the nanostructure may be another structure. Further, a case that a molecular beam epitaxy method is employed for manufacturing a semiconductor laminate structure is described. However, another method such as an organic metal thermal decomposition method may be employed.

First, the semiconductor substrate 11 made of GaAs is prepared, and introduced into a growing device. In the present process, a molecular beam epitaxy device is employed as one example of the growing device. After a natural oxide film on a substrate surface is removed by an ordinary substrate surface cleaning treatment such as raising a substrate temperature up to about 600° C., while radiating As, the first semiconductor layer 12 made of GaAs is grown on one major surface of the semiconductor substrate 11 ((a) of FIG. 5. The first semiconductor layer 12 is a buffer layer. As far as a surface of the semiconductor substrate 11 has crystallinity and cleanliness sufficient for succeeding growth, the first semiconductor layer 12 may be omitted. In the following manufacturing method, unless otherwise specifically mentioned, it is assumed that a manufacturing process in a state of a wafer for a semiconductor optical image sensor is described.

Next, the second semiconductor layer 13 is grown, as one example of a layer having a concave and convex surface on which nanostructures are randomly distributed ((b) of FIG. 5). The present example embodiment describes an example in which a quantum dot made of InAs is used as a nanostructure. Specifically, the second semiconductor layer 13 made of InAs quantum dots is grown by supplying In by an amount equivalent to 1.8 molecular layer (ML) at a substrate temperature of 480° C. in an As atmosphere. Since there is a lattice constant difference of about 7.2% between GaAs and InAs, the grown InAs grows into a three-dimensional island shape. The growth of the three-dimensional island shape is referred to as a Stranski Krastanov (SK) mode growth. Such the three-dimensional islands (quantum dots) made of InAs are formed at a random position on a growing surface, and has a characteristic such that a very thin (equivalent to about 1 to 2 molecular layers) InxGa1−xAs or InAs two-dimensional layer accompanies. Further, it is possible to control a forming surface density of InAs quantum dots by changing a growing parameter. For example, when a growth rate of InAs quantum dots is decreased, the density decreases, and when the growth rate is increased, the density increases. In other words, it is possible to control an average distance between quantum dots, according to an operating wavelength of a semiconductor active layer.

FIG. 7 is a graph illustrating a relationship between a quantum dot growth rate and a quantum dot surface density. FIG. 7 illustrates one example of a relationship between a growth rate of InAs quantum dots and a surface density. By changing a supply rate of InAs from 0.01 ML/s to 0.2 ML/s, it is possible to control a forming density of InAs quantum dots from $1\times10^8$ cm$^{-2}$ to $2\times10^{10}$ cm$^{-2}$. FIG. 8 illustrates an atomic force microphotograph of InAs quantum dots, when a forming density of InAs quantum dots is set to $1\times10^9$ cm$^{-2}$ by controlling a growth rate. In this case, an average interval of quantum dots becomes about 0.33 µm from calculation of a forming density. In other words, when it is assumed that a refractive index of a semiconductor is 3.0, the forming density is equivalent to an operating wavelength of an infrared device of a wavelength of about 1 µm. Thus, it becomes possible to set an average forming interval of quantum dots to a scale substantially equal to the typical structure scale d of a target texture structure. It is possible to control an average forming interval of quantum dots according to an operating wavelength of an optical device. Further, since quantum dots formed as described above have a characteristic such that the quantum dots are distributed at random on a wafer surface, it is possible to easily acquire randomly distributed quantum dots without performing a special process.

Thereafter, GaAs of about several µm in thickness is grown as the third semiconductor layer 14 on the second semiconductor layer 13 ((c) of FIG. 5. The third semiconductor layer 14 is formed in such a way that a random concave and convex surface of the second semiconductor layer 13 is embedded. Thereafter, the semiconductor active layer 15 made of a light absorbing medium including an InAs quantum dot absorbing layer is grown on the third semiconductor layer 14 ((d) of FIG. 5). Specifically, after a GaAs layer is grown by about several µm by radiating Ga at a substrate temperature of 580° C. in an As atmosphere, an InAs quantum dot layer is grown by supplying In by an amount equivalent to 2 to 3 ML at a supply rate of 0.2 ML/s at a substrate temperature of 480° C. Unlike the case of the second semiconductor layer 13, since a supply amount of In is large, it is possible to form InAs quantum dots at a high density of about $5\times10^{10}$ cm$^{-2}$. The quantum dots function as a light absorbing medium. By growing the three-dimensional island structures by embedding GaAs of about 50 nm in thickness, a semiconductor layer made of a light absorbing medium including an InAs quantum dot absorbing layer is formed. By repeating this process a plurality of times, the semiconductor active layer 15 including a large number of InAs quantum dot layers may be manufactured. Further, the semiconductor cover layer 16 made of GaAs of about several µm in thickness is successively grown, and a wafer for a semiconductor optical image sensor as illustrated in (e) of FIG. 5 is acquired.

Next, a process of forming a random texture structure on the third semiconductor layer 14 by using the wafer is described. First, the wafer is put upside down in such a way that the semiconductor substrate 11 becomes an upper surface. In the semiconductor optical device in FIG. 4, signal light is incident from the upper surface. In the present example embodiment, a hole structure (barus structure) in which a semiconductor substrate on a semiconductor substrate side associated with a region performing light emission/light reception is removed is manufactured, and a texture structure is manufactured on a bottom portion of the hole. This is for preventing attenuation of signal light by a semiconductor substrate, and strengthening interaction between a texture structure and a light active layer.

In the following, a method for partially removing the semiconductor substrate 11 is described. First, a photoresist is coated on an under surface of the semiconductor substrate 11 by an ordinary photolithography method, and an opening resist pattern 17 having a predetermined size depending on a device size is formed by contact exposure ((f) of FIG. 5).

The semiconductor substrate 11 is partially removed by using the opening resist pattern 17. Specifically, an opening slightly larger than a light receiving surface is manufactured on a back surface of the semiconductor substrate 11 made of GaAs by a photolithography method, GaAs in the opening region is removed by chemical etching, and an opening structure 18 is manufactured ((a) of FIG. 6). In the present example embodiment, since the semiconductor substrate 11 is made of GaAs, it is preferable to use a mixed solution of ammonia and hydrogen peroxide water. In an actual process, a thin $Al_xGa_{1-x}As$ layer of about 10 nm may be inserted between the semiconductor substrate 11 and the first semiconductor layer 12. Since a mixed solution of ammonia and hydrogen peroxide water has a property such that the mixed solution etches GaAs, but hardly etches $Al_xGa_{1-x}As$, etching of the GaAs layer of the semiconductor substrate 11 stops at the thin $Al_xGa_{1-x}As$ layer. It is possible to selectively remove the $Al_xGa_{1-x}As$ layer exposed from the opening portion by etching using dilute hydrochloric acid, and it is easy to remove the $Al_xGa_{1-x}As$ layer without invading the GaAs layer. Consequently, it is possible to manufacture the opening structure 18 as illustrated in (a) of FIG. 6.

Removal of the semiconductor substrate 11 may be performed by dry etching. Further, as far as materials of the semiconductor substrate 11 and the first semiconductor layer 12 are different, it is possible to perform selective etching by using a difference in etching speed between the materials. Depending on a material constituting each of the layers, in a case where wet etching is performed, an etchant may be changed, and in a case where dry etching is performed, reactant gas may be changed, as necessary. In the case of the present example embodiment, since both of the semiconductor substrate 11 and the first semiconductor layer 12 are made of GaAs, which is a same substance, an etching amount may be controlled by an etching rate and an etching time, and etching may be performed up to a boundary between the semiconductor substrate 11 and the first semiconductor layer 12.

After the partial removal of the semiconductor substrate 11 is finished, the first semiconductor layer 12 is removed by selective etching, etching is proceeded up to an interface of the second semiconductor layer 13, and the second semiconductor layer 13 is exposed within the opening structure 18. In the case of the present example embodiment, since the first semiconductor layer 12 is made of GaAs, and the second semiconductor layer 13 is made of InxGa1−xAs or InAs, it is preferable to employ dry etching by chlorine gas for the first semiconductor layer 12. Dry etching by chlorine gas is able to etch GaAs. However, in a case where a material containing In is used, an etching speed of the material drastically decreases, and the material is hardly etched. Therefore, in dry etching by chlorine gas, the etching stops at an interface with respect to the second semiconductor layer 13 containing In ((b) of FIG. 6). The etching method is not limited to the present method, as far as there is etching selectivity between a first semiconductor layer and a second semiconductor layer.

Subsequently, etching is proceeded up to a surface of the third semiconductor layer 14 by removing the second semiconductor layer 13 exposed within the opening structure 18 by selective etching ((c) of FIG. 6. In this case, since the second semiconductor layer 13 is made of $In_xGa_{1-x}As$ or InAs, and the third semiconductor layer 14 is made of GaAs, it is preferable to use hydrochloric acid as an etchant. In a case where this method is employed, conversely to dry etching by chlorine gas, $In_xGa_{1-x}As$ or InAs is etched, but GaAs is hardly etched. As a result of the process, a hole structure 19 associated with a shape of a nanostructure included in the second semiconductor layer 13 as illustrated in (c) of FIG. 6 appears on a surface of the third semiconductor layer 14. A surface configuration of the hole structure 19 is associated with a two-dimensional distribution of nanostructures of the second semiconductor layer 13, a forming position is random, and an average forming interval of holes becomes a value substantially equal to the typical structure scale d.

When a depth of a hole of the hole structure 19 is sufficient for exhibiting a characteristic of a random texture structure, the hole structure 19 may be employed as a texture structure. When a depth of a hole of the hole structure 19 is not sufficient to be employed as a texture structure, etching may be further proceeded in such a way that a deep hole is formed by using these holes as a seed, and a random texture structure 20 may be formed ((d) of FIG. 6. The etchant is not specifically limited, as far as a forming interval of holes can be secured. However, an etchant that selectively etches a defect or the like being present on a surface is more preferable. For example, it is possible to use, as an etchant, a mixed solution of hydrochloric acid, acetic acid, and hydrogen peroxide water. A mixing ratio of a mixed solution of hydrochloric acid, acetic acid, and hydrogen peroxide water may be such that hydrochloric acid:acetic acid:hydrogen peroxide water=1:2:1, for example. By performing etching by a mixed solution as described above, a hole (defect) portion is etched deeper, and it is possible to manufacture the random texture structure 20 having a large distribution also in a depth direction. A semiconductor optical device having a random texture structure within a barus structure illustrated in FIG. 4 is completed by removing the opening resist pattern 17 after the random texture structure 20 is manufactured.

FIG. 9 illustrates a surface photograph of one example of a random texture structure to be manufactured on GaAs. A portion where a defect (hole) is present on a surface is selectively etched, and a structure (random texture structure) having a random concave and convex is formed.

(Description on Advantageous Effects)

In the present example embodiment, it is possible to manufacture, in a simplified way, the hole structure 19 and the random texture structure 20 in which a size and a forming interval are controlled on a surface of the third semiconductor layer 14. Further, in the present example embodiment, it is possible to manufacture, in a simplified way, the hole structure 19 and the random texture structure 20 in which a size and a forming interval are controlled on a bottom surface inside a hole structure (barus structure) in which the semiconductor substrate 11 is partially removed.

Since a barus structure has a large concave and convex on a surface because a substrate is etched into a hole shape, it is extremely difficult to manufacture a texture structure by an ordinary photolithography method. Contrary to this, in the texture structure manufacturing method according to the present example embodiment, the second semiconductor layer 13 is grown by a crystal growth method. A three-dimensional island (quantum dot) of a nanostructure is formed at a random position on a growing surface by using a self-forming phenomenon of a crystal growth process, and the hole structure 19 and the random texture structure 20 are manufactured by using the above.

Thus, in the texture structure manufacturing method according to the present example embodiment, it is possible to manufacture the random texture structure 20, while omitting manufacturing a mask for a random pattern. Further, in the texture structure manufacturing method according to the present example embodiment, a structure of an etching pattern for manufacturing a texture structure is embedded by crystal growth at a stage of manufacturing a wafer beforehand. Therefore, even after a hole structure is manufactured, it is possible to manufacture a texture structure only by etching. Further, regarding the pattern by a nanostructure that is manufactured beforehand, it is possible to control a density, a size, a shape, and a structure of a nanostructure by changing a growing condition of crystal growth. Thus, it is possible to design a desired pattern according to a semiconductor light element to be manufactured.

Note that a random texture structure may also be formed on a surface (semiconductor cover layer 16) on the opposite side as necessary. In this case, the method according to the present example embodiment may be employed, or an ordinary photolithography method may be employed. Further, in the present example embodiment, InAs is used as a material for a quantum dot, and GaAs is used as a material for embedding the quantum dot. The material, however, is not limited to the above. As the quantum dot materials/embedding materials other than the above, for example, there are $In_xGa_{1-x}As/GaAs$, $In_xAl_{1-x}As/Al_xGa_{1-x}As$ or GaAs, $InP/InP/Ga_xIn_{1-x}As_yP_{1-y}$, and the like. The present example embodiment can be achieved by employing an etching method according to each of the material groups.

Second Example Embodiment

Next, a texture structure manufacturing method according to a second example embodiment of the present invention is described. The first example embodiment describes a method for manufacturing the random texture structure 20 on a bottom of a hole structure (barus structure) in which the semiconductor substrate 11 is partially removed. In a case where a total of thicknesses of growing layers from the third semiconductor layer 14 to the semiconductor cover layer 16 in the first example embodiment is sufficiently large, and the growing layers can be maintained even when a substrate is removed over the entire surface, or a case where a growing layer is joined to another semiconductor substrate or the like, it is also possible to manufacture a random texture structure by using a photolithography method by manufacturing a mask for a random pattern according to a background art. However, in the method according to the present example embodiment, it is possible to manufacture a random texture structure in a more simplified way. Elements similar to those in the first example embodiment are indicated with same reference numbers, and detailed description thereof is omitted.

(Description on Configuration)

FIG. 10 is a cross-sectional view of a semiconductor optical device to be manufactured by a texture structure manufacturing method according to the second example embodiment of the present invention. (a) to (d) of FIG. 11, and (a) to (d) of FIG. 12 are cross-sectional views illustrating a manufacturing process of the semiconductor optical device in FIG. 10.

The semiconductor optical device in FIG. 10 includes a third semiconductor layer 14, a semiconductor active layer 15, and a semiconductor cover layer 16. A random texture structure 20 is formed on the third semiconductor layer 14. The semiconductor optical device in FIG. 10 is a device in a case where a semiconductor substrate is removed over the entire surface.

(Description on Manufacturing Method)

Referring to FIGS. 11 and 12, the texture structure manufacturing method according to the present example embodiment is described. FIGS. 11 and 12 illustrate a random texture structure manufacturing process in which a semiconductor substrate 11 is finally removed over the entire surface. First, similarly to the first example embodiment, each of layers including a semiconductor active layer is grown by a crystal growth method. Specifically, a first semiconductor layer 12 made of GaAs is grown on one major surface of the semiconductor substrate 11 ((a) of FIG. 11). Next, as one example of a layer having concaves and convexes on which nanostructures are randomly distributed, a second semiconductor layer 13 is grown ((b) of FIG. 11). Next, the third semiconductor layer 14 is grown on the second semiconductor layer 13 ((c) of FIG. 11). Next, the semiconductor active layer 15 is grown on the third semiconductor layer 14, and then, the semiconductor cover layer 16 is grown ((d) of FIG. 11). A process being a wafer manufacturing process until the semiconductor cover layer 16 is grown is similar to the first example embodiment.

Next, a process of forming a random texture structure on the third semiconductor layer 14 by using the wafer is described. First, the wafer is put upside down in such a way that the semiconductor substrate 11 becomes an upper surface ((a) of FIG. 12). Next, the semiconductor substrate 11 is removed over the entire surface. The removal of the semiconductor substrate 11 is performed by wet etching or dry etching. When materials of the semiconductor substrate 11 and the first semiconductor layer 12 are different, it is possible to perform selective etching by using a difference in etching speed between the materials. Depending on a material constituting each of the layers, in a case where wet etching is performed, an etchant may be changed, and in a case where dry etching is performed, reactant gas may be changed, as necessary. Further, similarly to the first example embodiment, an etch stop layer may be introduced. In the case of the present example embodiment, since both of the semiconductor substrate 11 and the first semiconductor layer 12 are made of GaAs, which is a same substance, an etching amount is controlled by an etching rate and time, and etching is performed up to a boundary between the semiconductor substrate 11 and the first semiconductor layer 12 ((b) of FIG. 12).

After the removal of the semiconductor substrate 11 is finished, the first semiconductor layer 12 is removed by selective etching, and a surface of the second semiconductor layer 13 is exposed. In the case of the present example embodiment, since the first semiconductor layer 12 is made of GaAs, and the second semiconductor layer 13 is made of $In_xGa_{1-x}As$ or InAs, similarly to the first example embodiment, it is preferable to employ dry etching by chlorine gas for removal of the first semiconductor layer 12 made of GaAs. By the above-described process, it is possible to acquire a structure in which the second semiconductor layer 13 is exposed on a surface ((c) of FIG. 12).

Subsequently, etching is proceeded up to a surface of the third semiconductor layer 14 by removing the second semiconductor layer 13 by selective etching. In this case, since the second semiconductor layer 13 is made of $In_xGa_{1-x}As$ or InAs, and the third semiconductor layer 14 is made of GaAs, wet etching by hydrochloric acid as an etchant is employed. As a result of the etching, a hole structure 19 associated with a nanostructure included in the second semiconductor layer 13 as illustrated in (d) of FIG. 12 appears on a surface of the third semiconductor layer 14.

When a depth of a hole is sufficient for exhibiting a characteristic of a random texture structure, since the hole structure 19 can be employed as a random texture structure, the manufacturing process is finished. Specifically, the manufacturing process may be finished not for the semiconductor optical device illustrated in FIG. 10 but for a semiconductor optical device having the hole structure 19 illustrated in (d) of FIG. 12.

When a depth of a hole is not sufficient, similarly to the first example embodiment, etching is further proceeded in such a way that a deep hole is formed by using these holes as a seed. The etchant is not specifically limited, as far as a forming interval of holes can be secured. However, an etchant that selectively etches a defect or the like being present on a surface is more preferable. For example, by performing etching by a mixed solution being hydrochloric acid:acetic acid:hydrogen peroxide water=1:2:1, a hole (defect) portion is etched deeper. Therefore, it is possible to manufacture a random texture structure having a large distribution also in a depth direction. A region where a defect is present on a surface is selectively etched by the etching, and the random texture structure 20 having a random concave and convex is formed (FIG. 10).

The hole structure 19 and the random texture structure 20 are associated with a distribution of nanostructures serving as a seed. In the case of the present example embodiment, since a quantum dot is used as a nanostructure, a forming position is random. An average forming interval of quantum dots is controlled in such a way as to become a scale substantially equal to a typical structure scale d, which is intended to be manufactured in a first quantum dot manufacturing process. Therefore, a forming position of concave and convex of a texture structure formed on a surface is random, and an average forming interval also becomes a scale substantially equal to the typical structure scale d, which is intended to be manufactured. Consequently, it is possible to acquire the random texture structure 20.

Note that, also in a structure before the second semiconductor layer 13 is removed in FIG. 12(b) or 12(c), a texture structure having a random distribution in which an average interval is the structure parameter d is formed on a surface. It is possible to employ a state before the second semiconductor layer 13 is removed in (b) or (c) of FIG. 12, as a random texture structure, depending on a device structure or another condition.

(Description on Advantageous Effects)

In the present example embodiment, similarly to the first example embodiment, it is possible to manufacture, in a simplified way, the random texture structure 20 in which a size and a forming interval are controlled on a surface of the third semiconductor layer 14. In the texture structure manufacturing method according to the present example embodiment, similarly to the first example embodiment, the second semiconductor layer 13 is grown by a crystal growth method. A three-dimensional island (quantum dot) of a nano structure is formed at a random position on a growing surface by using a self-forming phenomenon of a crystal growth process, and the hole structure 19 and the random texture structure 20 are manufactured by using the above.

Thus, in the texture structure manufacturing method according to the present example embodiment, similarly to the first example embodiment, it is possible to manufacture the random texture structure 20, while omitting manufacturing a mask for a random pattern.

Third Example Embodiment

Next, a texture structure manufacturing method according to a third example embodiment of the present invention is described. In the first and second example embodiments, a quantum dot is used as a nano structure of the second semiconductor layer 13. However, a nanostructure is not limited to a quantum dot.

FIG. 13 is an atomic force microphotograph of a manufacturing example of a nanostructure having a structure in which several quantum dots are aggregated. FIG. 13 illustrates a state that some of isolated quantum dots illustrated in FIG. 8 are combined into an aggregate, and a new nanostructure is formed. The three-dimensional structures are such that not only a forming position thereof is random similarly to the first example embodiment, but also the number of combined quantum dots is random. Therefore, a size (height) of an aggregate also becomes random.

FIG. 14 is an electron microphotograph of a manufacturing example of a nanostructure formed by combining a large number of quantum dots. FIG. 14 is an electron microphotograph of a nanostructure to be formed, when a supply amount of InAs, which is 2 ML or less when a nanostructure in the first example embodiment is manufactured, is further increased, and InAs of about 100 ML is supplied. A structure of a size of about several 100 nm is formed on a surface over the entire surface. The surface of the nanostructures is surrounded by a certain specific crystal plane, and a shape thereof is also random. In the third example embodiment, a case that the structures are used as a nanostructure included in a second semiconductor layer is described.

(Description on Configuration)

A semiconductor optical device in FIG. 15 includes a third semiconductor layer 14, a semiconductor active layer 15, and a semiconductor cover layer 16. A random texture structure 20 is formed on the third semiconductor layer 14. Similarly to the second example embodiment, the semiconductor optical device in FIG. 15 is a device in a case where a semiconductor substrate is removed over the entire surface.

(Description on Manufacturing Method) In the following, a method for manufacturing the semiconductor optical device in FIG. 15 is described. (a) to (d) of FIG. 16, and (a) to (d) of FIG. 17 are cross-sectional views illustrating a manufacturing process of the semiconductor optical device in FIG. 15. FIGS. 16 and 17 illustrate a process of manufacturing a random texture structure by using a three-dimensional structure in which a nanostructure included in a second semiconductor layer is not a quantum dot. Note that the process in the present example embodiment is similar to the second example embodiment, except for a nanostructure manufacturing process.

First, a semiconductor substrate 11 made of GaAs is prepared, and a first semiconductor layer 12 made of GaAs is grown on one major surface of the semiconductor substrate 11 in accordance with a procedure similar to the first and second example embodiments ((a) of FIG. 16). Next, as one example of a layer including a concave and convex surface on which nanostructures are randomly distributed, a second semiconductor layer 13 is grown ((b) of FIG. 16). The present example embodiment describes an example in which a three-dimensional structure illustrated in FIG. 14 is used as a nanostructure. After a GaAs layer is grown by about several µm by radiating Ga at a substrate temperature of 580° C. in an As atmosphere, a three-dimensional structure formed by combining a large number of InAs quantum dots is formed by supplying In by an amount equivalent to about 100 ML. In the three-dimensional structure, since distortion due to lattice inconsistency in constituent substance between a substrate being grown and a growing layer is formed, it is necessary to reduce an influence of occurrence of transposition accompanied by the distortion. In the present example embodiment, the third semiconductor layer 14 made of GaAs is grown by several µm (herein, 3 µm) on the second semiconductor layer 13 ((c) of FIG. 16. By the growth of the third semiconductor layer 14, it is possible to avoid an influence by distortion.

Processes thereafter are similar to those of the second example embodiment. The semiconductor active layer 15 is grown on the third semiconductor layer 14, and the semiconductor cover layer 16 is grown ((d) of FIG. 16). Next, the wafer is put upside down in such a way that the semiconductor substrate 11 becomes an upper surface ((a) of FIG. 17). Next, the semiconductor substrate 11 is removed over the entire surface. In the case of the present example embodiment, since both of the semiconductor substrate 11 and the first semiconductor layer 12 are made of GaAs, which is a same substance, an etching amount is controlled by an etching rate and time, and etching is performed up to a boundary between the semiconductor substrate 11 and the first semiconductor layer 12 ((b) of FIG. 17). After the removal of the semiconductor substrate 11 is finished, the first semiconductor layer 12 is removed by selective etching, and a surface of the second semiconductor layer 13 is exposed. In the case of the present example embodiment, since the first semiconductor layer 12 is made of GaAs, and the second semiconductor layer 13 is made of $In_xGa_{1-x}As$ or InAs, similarly to the first example embodiment, it is preferable to employ dry etching by chlorine gas for removal of the first semiconductor layer 12 made of GaAs. As a result, a structure in which the second semiconductor layer 13 made of $In_xGa_{1-x}As$ or InAs is exposed on a surface is acquired ((c) of FIG. 17). Subsequently, etching is proceeded up to a surface of the third semiconductor layer 14 by removing the second semiconductor layer 13 by selective etching. In this case, since the second semiconductor layer 13 is made of $In_xGa_{1-x}As$ or InAs, and the third semiconductor layer 14 is made of GaAs, it is preferable to employ wet etching by hydrochloric acid as an etchant. As a result of the etching, a hole structure 19 associated with a nanostructure included in the second semiconductor layer 13 as illustrated in (d) of FIG. 17 appears on a surface of the third semiconductor layer 14.

When a depth of a hole of the hole structure 19 is sufficient for exhibiting a characteristic as a texture structure, the hole structure 19 is employed as a texture structure. Then, the texture structure manufacturing process is finished. Specifically, the manufacturing process may be finished not for the semiconductor optical device illustrated in FIG. 15 but for a semiconductor optical device having the hole structure 19 illustrated in (d) of FIG. 17.

Similarly to the first and second example embodiments, when a depth of a hole of the hole structure 19 is not sufficient, etching is further proceeded by using the holes as a seed, and the random texture structure 20 is formed. The etchant is not specifically limited, as far as a forming interval of holes can be secured. However, an etchant that selectively etches a defect or the like being present on a surface is more preferable. For example, by performing etching by a mixed solution being hydrochloric acid:acetic acid:hydrogen peroxide water=1:2:1, a hole (defect) portion is etched deeper. Therefore, it is possible to manufacture a random texture structure having a large distribution also in a depth direction. A region where a defect is present on a surface is selectively etched by the etching, and the random texture structure 20 is formed (FIG. 15).

The hole structure 19 and the random texture structure 20 formed on a surface are associated with a distribution of nanostructures serving as a seed. In the case of the present example embodiment, since a three-dimensional structure formed by combining a large number of InAs quantum dots is employed as a nanostructure, a forming position is random, and an average forming interval of quantum dots is controlled in such a way as to become a scale substantially equal to a typical structure scale d, which is intended to be manufactured in a first quantum dot manufacturing process. Therefore, a forming position of concave and convex of a texture structure formed on a surface is random, and an average forming interval also becomes a scale substantially equal to the typical structure scale d, which is intended to be manufactured. Consequently, it is possible to acquire the random texture structure 20.

Note that also in a structure before the second semiconductor layer 13 is removed in (b) or (c) of FIG. 17, the random texture structure 20 having a random distribution in which an average interval is the structure parameter d is formed on a surface. It is possible to employ a state before the second semiconductor layer 13 is removed in (b) or (c) of FIG. 17, as a random texture structure, depending on a device structure or another condition.

(Description on Advantageous Effects)

In the present example embodiment, similarly to the first and second example embodiments, it is possible to manufacture, in a simplified way, the random texture structure 20 in which a size and a forming interval are controlled on a surface of the third semiconductor layer 14. In the texture structure manufacturing method according to the present example embodiment, the second semiconductor layer 13 is grown by a crystal growth method. A three-dimensional island (quantum dot) of a nanostructure is formed at a random position on a growing surface by using a self-forming phenomenon of a crystal growth process, and the hole structure 19 and the random texture structure 20 are manufactured by using the above.

Thus, in the texture structure manufacturing method according to the present example embodiment, similarly to the first and second example embodiments, it is possible to manufacture the random texture structure 20, while omitting manufacturing a mask for a random pattern.

Further, in the present example embodiment, as a nanostructure of the second semiconductor layer 13, not a quantum dot as described in the first and second example embodiments, but a three-dimensional structure having a structure in which several quantum dots are aggregated is employed. In a three-dimensional structure as described in the present example embodiment, similarly to the first and second example embodiments, not only that a forming position of the three-dimensional structure is at random, but also that the number of combined quantum dots is random. Therefore, a size (height) of an aggregate also becomes random.

All of the nanostructures included in the second semiconductor layer 13 described in the first, second and third example embodiments are manufactured by using a self-forming phenomenon in a crystal growth process. In other words, unlike a method such as photolithography, it is possible to manufacture a nanostructure only by supplying a specific raw material in a crystal growing device, without the need of a mask or the like, for forming a structure, such as a resist or a dielectric. Therefore, the present method is very simple, and is less likely to be affected by contamination accompanied by a process. Further, a forming position is basically random, and it is possible to control an average interval of concaves and convexes of the structure by changing a basic growing condition of crystal growth such as a growth speed and a growth temperature. It is possible to arbitrarily design according to a specification of a device.

Fourth Example Embodiment

Next, a texture structure manufacturing method according to a fourth example embodiment of the present invention is described. The present example embodiment is one example of a case where the above-described texture manufacturing method is applied to a more specific thin film semiconductor optical sensor manufacturing method or random texture structure manufacturing process.

FIG. 18 is a cross-sectional view of a thin film semiconductor optical sensor according to the fourth example embodiment to be manufactured by applying a texture structure manufacturing method according to an example embodiment of the present invention. (a) to (d) of FIG. 19, and (a) to (d) of FIG. 20 are cross-sectional views illustrating a thin film semiconductor optical sensor manufacturing process according to the fourth example embodiment.

(Description on Configuration)

The thin film semiconductor optical sensor in FIG. 18 is a light receiving image sensor 100. The light receiving image sensor 100 in FIG. 18 includes a light absorbing medium 103, a second electrode 107, a first electrode 108, a first n-doped layer 109, a passivation film 111, a metal bump 112, a readout circuit chip 113, thermoset resin 114, and a random texture structure 115.

Herein, regarding an example of an infrared light receiving element employing an InAs quantum dot absorbing layer formed in a GaAs semiconductor layer, as the light absorbing medium 103 being a semiconductor active layer, one example of a manufacturing process including integrating into a readout circuit is described. The present manufacturing process described here is merely one example of a manufacturing process of a main constituent element of the present thin film semiconductor optical sensor element. An actual thin film semiconductor optical sensor element may be modified, as far as the modification exhibits an advantageous effect described in the present example embodiment by a component factor of another device structure.

(Description on Manufacturing Method)

A manufacturing method is described by using FIG. 19. First, a GaAs substrate 102 is prepared, and introduced into a growing device. In the present process, a molecular beam epitaxy device is employed as one example of the growing device. As far as the growing device is able to manufacture a thin film structure, another device, for example, an organic metal thermally decomposable film forming device may be available. A natural oxide film on a substrate surface is removed by an ordinary substrate surface cleaning treatment such as raising a substrate temperature up to about 600° C., while radiating As. Thereafter, a nanostructure layer 105 containing $In_xGa_{1-x}As$ is grown according to a method similar to the third example embodiment. An average forming interval of structures of the nanostructure layer 105 is assumed to be a scale substantially equal to a typical structure scale d, which is intended to be manufactured.

Thereafter, a GaAs layer is formed in such a way that a random pattern of a structure of the nanostructure layer 105 is embedded, and a second n-doped layer 110 is grown. The second n-doped layer 110 is formed in order to secure an ohmic contact with the first electrode 108 to be formed later. Thereafter, the light absorbing medium 103 including an InAs quantum dot absorbing layer is grown. Specifically, after a GaAs layer is grown by about several μm by radiating Ga at 580° C. in an As atmosphere, an InAs quantum dot layer is grown by supplying In by an amount equivalent to 2 to 3 ML at a substrate temperature of 480° C. By growing a three-dimensional island structure composed of the InAs quantum dot layers by embedding GaAs of about 50 nm in thickness, the light absorbing medium 103 including an InAs quantum dot absorbing layer is formed. By repeating this process a plurality of times, a quantum dot absorbing layer composed of a large number of InAs quantum dots may be manufactured. Further, after GaAs of about several μm in thickness is successively grown again, the growth of the light absorbing medium 103 is finished. Further, by growing the first n-doped layer 109 on the light absorbing medium 103, a wafer for a thin film semiconductor optical image sensor as illustrated in (a) of FIG. 19 is acquired. The first n-doped layer 109 is formed in order to secure an ohmic contact with the second electrode 107 to be formed later.

Next, in order to separate the light absorbing medium 103 into each element, a mesa structure 106 is formed by anisotropic etching (e.g., a mixed solution of ammonia water and hydrogen peroxide water) ((b) of FIG. 19). The second electrode 107 and the first electrode 108 are respectively formed by vapor deposition on the first n-doped layer 109 on each of the mesa structures 106, and on the second n-doped layer 110 that appears by etching ((c) of FIG. 19). Further, the passivation film 111 (e.g. $SiO_2$) is formed in such a way that an opening is located on an electrode portion by the second electrode 107 and the first electrode 108 ((d) of FIG. 19). Furthermore, a metal bump 112 (e.g. an indium bump) is formed on the second electrode 107 and the first electrode 108 in an opening of the passivation film 111 ((a) of FIG. 20). Lastly, a wafer is cut into each chip to form a light receiving chip.

Next, the readout circuit chip 113 in which a signal readout circuit is integrated in association with a cut light receiving chip is prepared, and the flipped light receiving chip and the readout circuit chip 113 are bonded with flip chip manner ((b) of FIG. 20). For the purpose of increasing a mechanical strength of a device, the thermoset resin 114 is filled in a clearance between the light receiving chip and the readout circuit chip 113 ((c) of FIG. 20).

Next, the GaAs substrate 102 of the light receiving chip is removed by selective wet etching (e.g. a mixture of citric acid and hydrogen peroxide water), and the nanostructure layer 105 is exposed ((d) of FIG. 20). Further, by removing the nanostructure layer 105 by selective wet etching with GaAs (e.g. buffered hydrofluoric acid), a GaAs layer 116 having a quantum dot random pattern embedded therein is exposed, and the light receiving image sensor 100 in which the random texture structure 115 having a structure such that a shape of quantum dots of the nanostructure layer 105 is transferred in the vicinity of a light receiving layer is formed is completed (FIG. 18).

(Description on Advantageous Effects)

In the present example embodiment, it is possible to manufacture, in a simplified way, the random texture structure 115 in which a size and a forming interval are controlled in the light receiving image sensor 100. In the manufacturing method of the random texture structure 115 according to the present example embodiment, similarly to the first to third example embodiments, the nanostructure layer 105 is grown by a crystal growth method. A three-dimensional island (quantum dot) of a nanostructure is formed at a random position on a growing surface by using a self-forming phenomenon of a crystal growth process, and the random texture structure 115 is manufactured by using the above.

Thus, it is possible to manufacture the random texture structure 115, while omitting manufacturing a mask for a random pattern. Further, it is possible to manufacture the light receiving image sensor 100 having the random texture structure 115 by applying a manufacturing process of a thin film semiconductor optical sensor.

Further, in the present example embodiment, it is possible to manufacture the random texture structure 115 at a position very close to the light absorbing medium 103 including an InAs quantum dot absorbing layer. Thus, it is possible to manufacture the light receiving image sensor 100 having the random texture structure 115 capable of reducing crosstalk by scattered light.

In the present example embodiment, it is possible to manufacture the light receiving image sensor 100 in which a texture structure having a random planar orientation is formed on a light receiving surface. Therefore, it is possible to improve reliability, and reduce a problem on productivity. In the present example embodiment, it is possible to provide a thin film semiconductor optical sensor capable of sufficiently exhibiting potential performance thereof.

Fifth Example Embodiment

Next, a texture structure manufacturing method according to a fifth example embodiment of the present invention is described. Similarly to the fourth example embodiment, the present example embodiment is one example of a case where the above-described texture structure manufacturing method is applied to a more specific thin film semiconductor optical sensor manufacturing method or random texture structure manufacturing process.

FIG. 21 is a cross-sectional view of a thin film semiconductor optical sensor to be manufactured by applying a texture structure manufacturing method according to the fifth example embodiment of the present invention. (a) to (d) of FIG. 22, (a) to (c) of FIG. 23, and (a) and (b) of FIG. 24 are cross-sectional views illustrating a manufacturing process of the thin film semiconductor optical sensor in FIG. 21.

(Description on Configuration)

The thin film semiconductor optical sensor in FIG. 21 is a light receiving image sensor 200. Similarly to the fourth example embodiment, the light receiving image sensor 200 in FIG. 21 includes a light absorbing medium 103, a second electrode 107, a first electrode 108, a first n-doped layer 109, a passivation film 111, a metal bump 112, a readout circuit chip 113, and a thermoset resin 114. Further, the light receiving image sensor 200 in FIG. 21 includes a random texture structure 215.

(Description on Manufacturing Method)

The light receiving image sensor 200 in the present example embodiment is manufactured by a manufacturing process similar to the fourth example embodiment up to (*a*) to (*d*) of FIG. 22, (*a*) to (*c*) of FIG. 23, and (*a*) of 24.

Specifically, a quantum dot nanostructure layer 205 made of $In_xGa_{1-x}As$ is grown on a GaAs substrate 102. Herein, the nanostructure layer 205 in the present example embodiment is assumed to have a dot growth density of a scale substantially equal to a typical structure scale d of a scattering surface, which is intended to be manufactured.

Thereafter, a GaAs layer is formed in such a way that a random pattern of a structure of the nanostructure layer 205 is embedded, and a second n-doped layer 110 is grown. The second n-doped layer 110 is formed in order to secure an ohmic contact with the first electrode 108 to be formed later. Thereafter, the light absorbing medium 103 including an InAs quantum dot absorbing layer is grown. Further, by growing the first n-doped layer 109 on the light absorbing medium 103, a wafer for a thin film semiconductor optical image sensor as illustrated in (*a*) of FIG. 22 is acquired. The first n-doped layer 109 is formed in order to secure an ohmic contact with the second electrode 107 to be formed later.

Next, in order to separate the light absorbing medium 103 into each element, a mesa structure 106 is formed by anisotropic etching ((*b*) of FIG. 22). The second electrode 107 and the first electrode 108 are respectively formed by vapor deposition on the first n-doped layer 109 on each of the mesa structures 106, and on the second n-doped layer 110 that appears by etching ((*c*) of FIG. 22). Further, the passivation film 111 is formed in such a way that an opening is located on an electrode portion by the second electrode 107 and the first electrode 108 ((*d*) of FIG. 22). Furthermore, the metal bump 112 is formed on the second electrode 107 and the first electrode 108 in an opening of the passivation film 111 ((*a*) of FIG. 23). Lastly, a wafer is cut into each chip to form a light receiving chip. Next, the readout circuit chip 113 in which a signal readout circuit is integrated in association with a cut light receiving chip is prepared, and the flipped light receiving chip and the readout circuit chip 113 are bonded with flip chip manner ((*b*) of FIG. 23). For the purpose of increasing a mechanical strength of a device, the thermoset resin 114 is filled in a clearance between the light receiving chip and the readout circuit chip 113 ((*c*) of FIG. 23).

Next, a GaAs substrate of the light receiving chip is removed by selective wet etching (e.g. a mixture of citric acid and hydrogen peroxide water), and the nanostructure layer 205 is exposed ((*a*) of FIG. 24). Further, the nanostructure layer 205 is removed. In the present example embodiment, after the nanostructure layer 205 is removed, a GaAs layer 216 in which a hole embedded with a quantum dot is formed at random at an interval of about a typical structure scale d is exposed ((*b*) of FIG. 24). By performing anisotropic etching with respect to this surface, etching is selectively proceeded in such a way that the hole embedded with a quantum dot is enlarged, and a scattering surface having the typical structure scale d can be acquired (FIG. 21). Thus, the light receiving image sensor 200 in which the random texture structure 215 is formed by using a quantum dot layer is completed.

(Description on Advantageous Effects)

In the present example embodiment, similarly to the fourth example embodiment, it is possible to manufacture, in a simplified way, the random texture structure 215 in which a size and a forming interval are controlled in the light receiving image sensor 200. In the manufacturing method of the random texture structure 215 according to the present example embodiment, similarly to the first to fourth example embodiments, the nanostructure layer 205 is grown by a crystal growth method. A three-dimensional island (quantum dot) of a nanostructure is formed at a random position on a growing surface by using a self-forming phenomenon of a crystal growth process, and the random texture structure 215 is manufactured by using the above.

Thus, it is possible to manufacture the random texture structure 215, while omitting manufacturing a mask for a random pattern. Further, it is possible to manufacture the light receiving image sensor 200 having the random texture structure 215 by applying a manufacturing process of a thin film semiconductor optical sensor.

In the present example embodiment, it is possible to manufacture the light receiving image sensor 100 in which a texture structure having a random planar orientation is formed on a light receiving surface. Therefore, it is possible to improve reliability, and reduce a problem on productivity. In the present example embodiment, it is possible to provide a thin film semiconductor optical sensor capable of sufficiently exhibiting potential performance thereof.

In the foregoing, preferred example embodiments and examples according to the present invention are described. The present invention, however, is not limited to the above. For example, in the above-described example embodiments, a case of forming a texture on a semiconductor is described. The present invention, however, is not limited to the above. A texture may be formed on a conductor or an insulator. It is possible to control any of a density, a size, a shape, and a structure of a nanostructure by changing a crystal growth condition of a nanostructure. The nanostructure may be constituted of a quantum dot, a quantum dash, or a mixed structure of either of a quantum dot structure or a quantum dash structure, or a combined structure of a quantum dot structure and a quantum dash structure. The above-described optical device may include a light emitting element or a light receiving element. Further, the above-described optical device may be a quantum dot infrared sensor. It is needless to say that various modifications are available within the scope of the invention described in the claims, and the modifications are also included within the scope of the present invention.

The whole or part of the example embodiments disclosed above can be described as, but not limited to, the following supplementary notes.

(Supplementary Note 1)

A method for manufacturing a texture structure comprising: growing a layer including a randomly distributed nanostructure on one major surface of a base material; forming a light-scattering body having the nano structure embedded therein; and exposing a surface of the light-scattering body by removing a part or whole of the base material and the layer including the nanostructure.

(Supplementary Note 2)

The method for manufacturing a texture structure according to supplementary note 1, wherein an exposed surface of the light-scattering body has concaves and convexes.

(Supplementary Note 3)

The method for manufacturing a texture structure according to supplementary note 1 or 2, further comprising etching a surface of the light-scattering body by using a concave or a convex on an exposed surface of the light-scattering body as a base point.

(Supplementary Note 4)

The method for manufacturing a texture structure according to any one of supplementary notes 1 to 3, further comprising controlling any of a density, a size, a shape, and a structure of the nanostructure by changing a crystal growth condition of a layer including the nanostructure.

(Supplementary Note 5)

The method for manufacturing a texture structure according to any one of supplementary notes 1 to 4, wherein the nanostructure is constituted of a quantum dot, a quantum dash, a mixed structure of either of a quantum dot structure or a quantum dash structure, or a combined structure of a quantum dot structure and a quantum dash structure.

(Supplementary Note 6)

The method for manufacturing a texture structure according to any one of supplementary notes 1 to 5, wherein the light-scattering body is a conductor, a semiconductor, or an insulator.

(Supplementary Note 7)

A manufacturing method of a semiconductor optical sensor employing the method for manufacturing a texture structure according to any one of supplementary notes 1 to 6, comprising: forming a semiconductor active layer on one major surface of a semiconductor substrate; growing a layer including a randomly distributed nanostructure on the semiconductor active layer; forming a light-scattering body having the nano structure embedded therein; and exposing a surface of the light-scattering body by removing a part or whole of the base material and the layer including the nanostructure.

(Supplementary Note 8)

The manufacturing method of the semiconductor optical sensor according to supplementary note 7, further comprising: forming a barus structure by removing a part of the semiconductor substrate; and forming a texture structure by the light-scattering body on a bottom portion of the barus structure.

(Supplementary Note 9)

The manufacturing method of the semiconductor optical sensor according to supplementary note 7 or 8, further comprising forming a mesa structure of a light absorbing medium on one major surface of the light-scattering body, after forming the light-scattering body having the nanostructure embedded therein.

(Supplementary Note 10)

The manufacturing method of the semiconductor optical sensor according to any one of supplementary notes 7 to 9, wherein the semiconductor optical sensor includes a light emitting element or a light receiving element.

(Supplementary Note 11)

The manufacturing method of the semiconductor optical sensor according to any one of supplementary notes 8 to 10, wherein the semiconductor optical sensor is a quantum dot infrared sensor.

(Supplementary Note 12)

The manufacturing method of the semiconductor optical sensor according to any one of supplementary notes 8 to 11, further comprising forming a mesa structure of a light absorbing medium on one major surface of the light-scattering body, after forming the light-scattering body embedding the concave and convex surface.

(Supplementary Note 13)

The manufacturing method of the semiconductor optical sensor according to any one of supplementary notes 8 to 12, comprising: a process of manufacturing a semiconductor wafer including a semiconductor growing layer having the nanostructure and the semiconductor active layer on a first semiconductor substrate by a crystal growth method; a process of processing a growing layer including the semiconductor active layer into a mesa of a predetermined size; a process of manufacturing a bump structure on the mesa; a process of bonding a first semiconductor substrate on a second semiconductor substrate in which a signal readout circuit is integrated, by using the bump structure; and a process of removing the first semiconductor substrate and manufacturing a texture by employing the exposed nanostructure.

In the foregoing, the present invention is described by using the above-described example embodiments as an exemplary example. The present invention, however, is not limited to the above-described example embodiments. Specifically, the present invention is applicable to various aspects comprehensible to a person skilled in the art within the scope of the present invention.

REFERENCE SIGNS LIST

1 Optical image sensor
2 Substrate
3 Light absorbing medium
4 Light incident surface texture structure
5 Back surface texture structure
6 Light reflecting body
7 Second electrode
8 First electrode
9 Incident light
11 Semiconductor substrate
12 First semiconductor layer
13 Second semiconductor layer
14 Third semiconductor layer
15 Semiconductor active layer
16 Semiconductor cover layer
17 Opening resist pattern
18 Opening structure
19 Hole structure
20 Random texture structure
100, 200 Light receiving image sensor
102 GaAs substrate
103 Light absorbing medium
105 Nanostructure layer
106 Mesa structure
107 Second electrode
108 First electrode
109 First n-doped layer
110 Second n-doped layer
111 Passivation film
112 Metal bump
113 Readout circuit chip
114 Thermoset resin
115, 215 Random texture structure
205 Nanostructure layer
216 GaAs layer

The invention claimed is:

1. A method for manufacturing a texture structure comprising:
   growing a layer including a randomly distributed nanostructure on one major surface of a base material;
   forming a light-scattering body having the nanostructure embedded therein; and
   exposing a surface of the light-scattering body by removing a part or whole of the base material and the layer including the nanostructure, wherein
   the nanostructure is constituted of a quantum dot, a quantum dash, a mixed structure of either of a quantum dot structure or a quantum dash structure, or a combined structure of a quantum dot structure and a quantum dash structure.

2. The method for manufacturing a texture structure according to claim 1, wherein an exposed surface of the light-scattering body has concaves and convexes.

3. The method for manufacturing a texture structure according to claim 1, further comprising etching a surface of the light-scattering body by using a concave or a convex on an exposed surface of the light-scattering body as a base point.

4. The method for manufacturing a texture structure according to claim 1, further comprising controlling any of a density, a size, a shape, and a structure of the nanostructure by changing a crystal growth condition of a layer including the nanostructure.

5. The method for manufacturing a texture structure according to claim 1, wherein the light-scattering body is a conductor, a semiconductor, or an insulator.

6. A manufacturing method of a semiconductor optical sensor employing the method for manufacturing a texture structure according to claim 1, comprising:
   forming a semiconductor active layer on one major surface of a semiconductor substrate;
   growing a layer including a randomly distributed nanostructure on the semiconductor active layer;
   forming a light-scattering body having the nanostructure embedded therein; and
   exposing a surface of the light-scattering body by removing a part or whole of the base material and the layer including the nanostructure.

7. The manufacturing method of the semiconductor optical sensor according to claim 6, further comprising: forming a barus structure by removing a part of the semiconductor substrate; and forming a texture structure by the light-scattering body on a bottom portion of the barus structure.

8. The manufacturing method of the semiconductor optical sensor according to claim 7, wherein the semiconductor optical sensor is a quantum dot infrared sensor.

9. The manufacturing method of the semiconductor optical sensor according to claim 7, comprising: forming a mesa structure of a light absorbing medium on one major surface of the light-scattering body, after forming the light-scattering body embedding the concave and convex surface.

10. The manufacturing method of the semiconductor optical sensor according to claim 7, comprising:
   a process of manufacturing a semiconductor wafer including a semiconductor growing layer having the nanostructure and the semiconductor active layer on a first semiconductor substrate by a crystal growth method;
   a process of processing a growing layer including the semiconductor active layer into a mesa of a predetermined size;
   a process of manufacturing a bump structure on the mesa;
   a process of bonding a first semiconductor substrate on a second semiconductor substrate in which a signal readout circuit is integrated, by using the bump structure; and
      a process of removing the first semiconductor substrate and manufacturing a texture by employing the exposed nanostructure.

11. The manufacturing method of the semiconductor optical sensor according to claim 6, further comprising: forming a mesa structure of a light absorbing medium on one major surface of the light-scattering body, after forming the light-scattering body having the nanostructure embedded therein.

12. The manufacturing method of the semiconductor optical sensor according to claim 6, wherein the semiconductor optical sensor includes a light emitting element or a light receiving element.

13. A manufacturing method of a semiconductor optical sensor employing the method for manufacturing a texture structure including growing a layer including a randomly distributed nanostructure on one major surface of a base material, forming a light-scattering body having the nanostructure embedded therein, and exposing a surface of the light-scattering body by removing a part or whole of the base material and the layer including the nanostructure, comprising:
   forming a semiconductor active layer on one major surface of a semiconductor substrate;
   growing a layer including a randomly distributed nanostructure on the semiconductor active layer;
   forming a light-scattering body having the nanostructure embedded therein; and
   exposing a surface of the light-scattering body by removing a part or whole of the base material and the layer including the nanostructure.

14. The manufacturing method of the semiconductor optical sensor according to claim 13, further comprising: forming a barus structure by removing a part of the semiconductor substrate; and forming a texture structure by the light-scattering body on a bottom portion of the barus structure.

15. The manufacturing method of the semiconductor optical sensor according to claim 14, wherein the semiconductor optical sensor is a quantum dot infrared sensor.

16. The manufacturing method of the semiconductor optical sensor according to claim 14, comprising: forming a mesa structure of a light absorbing medium on one major surface of the light-scattering body, after forming the light-scattering body embedding the concave and convex surface.

17. The manufacturing method of the semiconductor optical sensor according to claim 14, comprising:
   a process of manufacturing a semiconductor wafer including a semiconductor growing layer having the nanostructure and the semiconductor active layer on a first semiconductor substrate by a crystal growth method;
   a process of processing a growing layer including the semiconductor active layer into a mesa of a predetermined size;
   a process of manufacturing a bump structure on the mesa;
   a process of bonding a first semiconductor substrate on a second semiconductor substrate in which a signal readout circuit is integrated, by using the bump structure; and
   a process of removing the first semiconductor substrate and manufacturing a texture by employing the exposed nanostructure.

18. The manufacturing method of the semiconductor optical sensor according to claim 13, further comprising: forming a mesa structure of a light absorbing medium on one major surface of the light-scattering body, after forming the light-scattering body having the nanostructure embedded therein.

19. The manufacturing method of the semiconductor optical sensor according to claim 13, wherein the semiconductor optical sensor includes a light emitting element or a light receiving element.

* * * * *